(12) United States Patent
Osaka et al.

(10) Patent No.: US 6,983,023 B2
(45) Date of Patent: Jan. 3, 2006

(54) DATA TRANSMISSION SYSTEM OF DIRECTIONAL COUPLING TYPE USING FORWARD WAVE AND REFLECTION WAVE

(75) Inventors: Hideki Osaka, Oiso (JP); Susumu Hatano, Higashimurayama (JP); Toyohiko Komatsu, Yokohama (JP); Tsutomu Hara, Fujisawa (JP)

(73) Assignee: Renesas Technology Corp., Tokyo (JP)

( * ) Notice: Subject to any disclaimer, the term of this patent is extended or adjusted under 35 U.S.C. 154(b) by 727 days.

(21) Appl. No.: 09/908,710

(22) Filed: Jul. 20, 2001

(65) Prior Publication Data
US 2002/0018526 A1    Feb. 14, 2002

(30) Foreign Application Priority Data
Aug. 9, 2000    (JP) ............................. 2000-247920

(51) Int. Cl.
*H04B 3/00* (2006.01)

(52) U.S. Cl. ........................................ 375/257; 326/86
(58) Field of Classification Search ................ 375/219, 375/220, 257; 326/30, 86, 82; 327/292, 327/108, 141, 333
See application file for complete search history.

(56) References Cited

U.S. PATENT DOCUMENTS

| | | | |
|---|---|---|---|
| 5,355,391 A * | 10/1994 | Horowitz et al. | 375/257 |
| 5,663,661 A * | 9/1997 | Dillon et al. | 326/30 |
| 5,910,927 A * | 6/1999 | Hamamoto et al. | 365/230.03 |
| 6,460,102 B1 * | 10/2002 | Choi | 710/110 |
| 6,600,790 B1 * | 7/2003 | Umemura et al. | 375/257 |
| 6,745,268 B1 * | 6/2004 | Greeff et al. | 710/100 |
| 6,810,449 B1 * | 10/2004 | Barth et al. | 710/61 |

* cited by examiner

*Primary Examiner*—Emmanuel Bayard
(74) *Attorney, Agent, or Firm*—Matting Stanger Malur & Brundidge, P.C.

(57) ABSTRACT

A memory module bus system using a plurality of directional couplers to permit high-density packaging. A wiring line (main line) extending from a main controller and cooperating with a sub coupling line to form a directional coupler is open-ended or short-circuited to ensure that a forward wave and a reflection wave can be used to generate signals in opposite directions of the directional coupler. Memory modules are connected to opposite ends of the sub coupling line. The line length of the coupler can be half the pitch between the memory modules.

28 Claims, 30 Drawing Sheets

LAYER STACKING

PRIO ART

DRAM I/O INTERFACE CIRCUIT

MEMORY WRITE DIRECTION (DRAM 10-2 TO MC 10-1)

MEMORY READ DIRECTION (DRAM 10-3 TO MC 10-1)

MEMORY READ DATA (DRAM10-2 (C))

| WRITE DATA | IMPEDANCE | | |
|---|---|---|---|
| | MC10-1 | DAM10-2 | DAM10-3 |
| MC10-1 → DRAM10-2 | RTT | HiZ | RTT |
| MC10-1 → DRAM10-3 | RTT | RTT | HiZ |
| READ DATA | | | |
| DRAM10-2 → MC10-1 | RTT | LOW | RTT |
| DRAM10-3 → MC10-1 | RTT | RTT | LOW |

DATA TRANSMISSION SYSTEM OF DIRECTIONAL COUPLING TYPE USING FORWARD WAVE AND REFLECTION WAVE

CROSS-REFERENCES TO RELATED APPLICATIONS

This application relates to applications U.S. Ser. No. 09/297,359 filed on Apr. 30, 1999 entitled "GAP-COUPLING TYPE BUS SYSTEM" by Osaka et al, U.S. Ser. No. 09/429,441 filed on Oct. 28, 1999 entitled "DIRECTIONAL BUS SYSTEM USING PRINTED BOARD" by Osaka et al, and U.S. Ser. No. 09/569,876 filed on May 12, 2000 entitled "DIRECTIONAL COUPLING MEMORY MODULE" by Osaka et al all assigned to the assignee of the present application. The disclosures of the above applications are incorporated by reference into that of the present application.

BACKGROUND OF THE INVENTION

The present invention relates to techniques for signal transmission between devices such as multiprocessors or memories (for example, digital circuits constructed of CMOS's or between their functional blocks) in an information processing apparatus and more particularly, to a technique of increasing the speed of bus transmission in which a plurality of devices are connected to the same transmission line and data transfer is carried out between the devices. Especially, the present invention is concerned with a bus for connecting a plurality of memory modules and a memory controller and a system using the bus.

As a bus system connected with many nodes to perform high-speed data transfer, a non-contact bus wiring line has been known as disclosed in U.S. Pat. No. 5,638,402 (JP-A-7-141079). A fundamental system of this type is shown in FIG. 2. In the system, data transfer between two nodes is effected using a crosstalk generation portion or directional coupler having a length of L. More particularly, in the known transfer technique, data transfer between a bus master 10-1 and slaves 10-2 to 10-3 is carried out using crosstalk between two lines, that is, between a terminated wiring line 1—1 and terminated wiring lines 1-2 and 1-3 each having a length of L. This is suited to one to multiple inter-transfer such as data transfer between the single bus master 10-1 and the plural slaves 10-2 and 10-3 and is suitably applied to data transfer between a memory controller and memories.

In the prior art disclosed in U.S. Pat. No. 5,638,402 (JP-A-7-141079) assigned to the present assignee, however, the line length L occupied by the directional coupler determines the pitch between the bus slaves 10-2 and 10-3. In FIG. 2, the wiring length occupied by the two bus slaves DRAM's 10-1 and 10-2 is 2L at the minimum and the pitch between the DRAM's amounts up to L.

A simple way to increase the density in the system, that is, to decrease the pitch between the DRAM's is to shorten the wiring length L of the directional coupler but this expedient leads to a decrease in transmission efficiency or coupling degree and therefore, the pitch cannot be reduced to below a predetermined value, for example, 30 mm.

SUMMARY OF THE INVENTION

A first object of the present invention is to narrow the pitch between memories such as DRAM's with a view to packaging a memory system in high density.

A second object of the present invention is to solve a problem that the latency in write data is long in a memory module system using a DQS signal for latching a DQ signal, for example, a DDR-SDRAM (Double Data Rate Synchronous DRAM).

A SSTL (Stub Series Terminated Logic) interface adopted in the DDR-SDRAM has a HiZ state identical to a termination voltage of Vtt and a reference voltage Vref of a receiver is approximately equal to the termination voltage Vtt. Here, the HiZ state means a state in which the driver of the interface does not deliver data, that is, a high-impedance state. Therefore, transition from HiZ state to L (low) state or from HiZ state to H (high) state cannot be recognized (here, L state and H state are called with respect to Vtt). Accordingly, before data transfer, a strobe signal is once shifted from HiZ state to L state and thereafter, data transfer is caused to proceed. This portion is especially called a preamble and because of the presence of the preamble, the write access time is prolonged.

Further, when the bus uses the SSTL driver and the directional coupler, that is, when the main line and the sub coupling lines as shown in FIG. 2 are terminated, the amplitude of the preamble portion is half the amplitude of data transfer. In other words, the signal amplitude during the transition of the drive amplitude from HiZ state to L state or from HiZ state to H state is about half the signal amplitude during the transition of the drive amplitude from L state to H state or vice versa. Consequently, in the preamble portion, the amplitude inputted to the receiver during write data and read data is half the amplitude in the data portion and so a shortage of sensitivity of the receiver results, making it necessary to assure the signal amplitude.

As described above, in case the SSTL driver is used, the strobe signal must be once shifted from HiZ state to L state to assure the signal amplitude and as a result, the access time is prolonged during memory write.

In order to accomplish the first object, according to one embodiment of the present invention, a driver for signal transmission of a main controller (MC) 10-1 has an impedance equal to a characteristic impedance Zo of a wiring line (main line) 1—1 connected to the driver so that re-reflection at the driver may be avoided. Further, the main line has a remote or far end that is an open-ended to cause a signal to undergo total reflection at the open-end. A directional coupler formed of two parallel wiring lines has, as named so, a characteristic for discriminating signals in signal transmission direction. More particularly, in case a signal propagates on the main line, representing one line of the directional coupler, and induces a signal in the other line (sub coupling line) of the directional coupler, the signal is induced only at a terminal close to the MC when a forward wave travels on the main line in the leaving direction as viewed from the MC 10-1 but the signal is induced only at a terminal remote from the MC when a reflection wave returns on the main line to approach the MC.

The directional coupler can pick up separately crosstalk signals due to the forward wave and reflection wave of the signal propagating on the main line at the opposite ends of the sub coupling line, respectively. Therefore, two memory modules can be connected to one coupler. In other words, two memories can be connected within the line length of the directional coupler to thereby double the packaging density.

When the main line is folded or turned around, directional couplers can be formed in different layers, so that the directional couplers can overlap each other to further halve the pitch between the memories. Consequently, the pitch between the memory modules can be narrowed to a great extent as compared to that in the prior art and advantageously, the packaging area can be reduced.

In order to accomplish the second object, according to another embodiment of the present invention, the memory controller has a signal for data transfer that is binary and has, on the side near the memory controller, its impedance equal to the characteristic impedance of the wiring line. More particularly, a HiZ state in which data is not transferred and a H state are at the same potential and the MC is driven through the impedance equal to the characteristic impedance of the wiring line. In other words, the input impedance equals the characteristic impedance. During L state of data, the L signal is driven through the same impedance as the characteristic impedance. In this manner, the reflection wave can be absorbed.

When the signal is driven from HiZ state to L state and from H state to L state, the amplitude remains unchanged and as a result, signals passing through the coupler during two transfer operations can have the same amplitude. Thus, during any transition of signal, the signal amplitude remains unchanged and the preamble is unneeded. Because the preamble is unnecessary, the memory access time can be shortened and the bus utilization efficiency can be raised to thereby improve the system performance.

Other objects, features and advantages of the present invention will become apparent from the following description of the embodiments of the invention-taken in conjunction with the accompanying drawings.

DETAILED DESCRIPTION OF THE EMBODIMENTS

A first embodiment of a bus system according to the invention will be described with reference to FIG. 1.

The bus system comprises an LSI chip 10-1 having a memory controller control mechanism (hereinafter simply referred to as a MC (memory controller) 10-1) and memory chips 10-2 to 10-5 (hereinafter simply referred to as DRAM's 10-2 to 10-5).

The MC 10-1 operates to read/write data from/to the DRAM's 10-2 to 10-5. Wiring lines 1—1 to 1-3 for read/write data transfer are provided, among which the line 1—1 connected to the MC 10-1 is especially called a main line. The line 1-2 includes three parts including a sub coupling line having a length of L and wired in parallel with the main line 1—1 to form a directional coupler and two stub lines led from both ends of the sub coupling line physically vertically thereof. In FIG. 1, the L-length sub coupling lines of lines 1-2 and 1-3 cooperate with the main line 1—1 to form directional couplers C1 and C2, respectively. Therefore, each of the directional couplers does not include the led stub lines.

Data signal propagation between the MC 10-1 and each of the DRAM's 10-2 to 10-5 is carried out by means of the respective directional couplers C1 and C2 indicated by inverted "C" mark. These directional couplers are equivalent to those described in JP-A-7-141079. According to the literature, data transfer between two nodes is carried out using crosstalk that represents coupling between two parallel wiring lines (directional coupler). More particularly, data transfer between the MS (bus master) 10-1 and each of the memory chips (bus slaves) 10-2 to 10-5 is effected using crosstalk between the two lines, that is, between the main line 1—1 and each of the wiring lines 1-2 and 1-3.

An I/O circuit of each of the DRAM's 10-2 to 10-5 has a built-in termination resistor. Thus, the I/O circuit of each of the DRAM's 10-2 to 10-5 has an input impedance equal to a characteristic impedance of each of the lines 1-2 to 1-3 connected to the I/O circuits. Consequently, no reflection takes place at the I/o circuit. With this construction, a signal generated by each directional coupler C1 or C2 propagates to the stub line and it is not reflected at the input terminal of each of the DRAM's 10-2 to 10-5. The termination as above may be implemented by means of either a MOS transistor inside the DRAM or an externally provided resistor.

Figure 1:
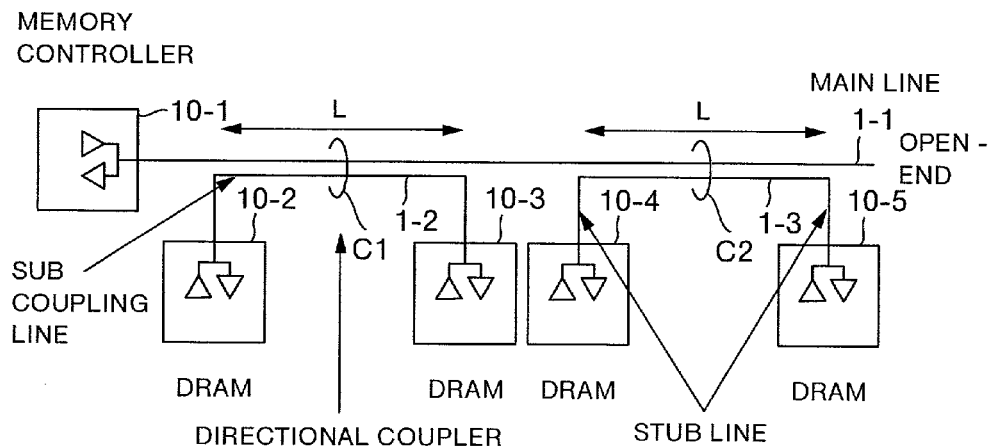
FIG. 1 is a schematic block circuit diagram for explaining a first embodiment of a bus system according to the present invention.

One end of the main line 1—1, remote as viewed from the MC 10-1, terminates in a very high impedance as compared to a characteristic impedance owned by the main line 1—1, particularly terminating in an open-end in the case of FIG. 1. The main line 1—1 has a reflection coefficient of approximately 1 and voltage on the main line undergoes total reflection.

A driver of I/O of the MC 10-1 has an impedance equal to the characteristic impedance of the main line 1—1 and no reflection takes place at the driver. In FIG. 1, the four DRAM's 10-2 to 10-5 are provided but the number of DRAM's may be either increased or decreased without impairing the effects of the invention.

Figure 3:
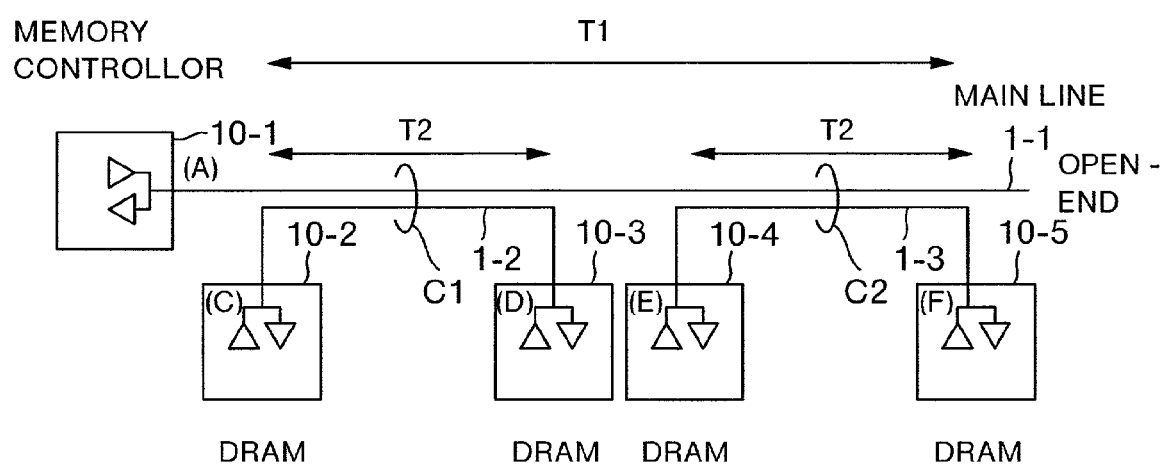
FIG. 3 is a schematic block circuit diagram for explaining the first embodiment.
Figure 4:
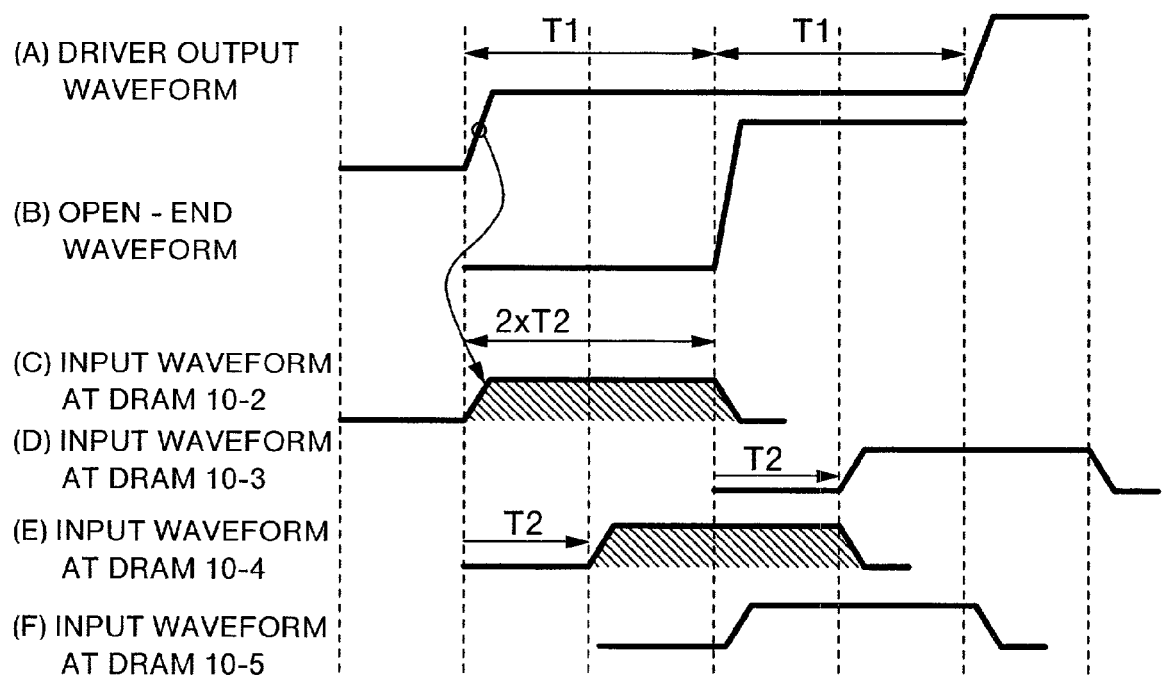
FIG. 4 is a timing chart of write from a MC to a DRAM in the first embodiment.

Referring now to FIGS. 3 and 4, operation of signal propagation between the MC 10-1 and each of the DRAM's 10-2 to 10-5 shown in FIG. 1.

The same components as those in FIG. 1 are designated by the same reference numerals in FIGS. 3 and 4 and will not be described again.

Functionally, the main line 1—1 can be sorted into portions constituting the couplers C1 and C2 (sub coupling lines) and wiring lines connecting the sub coupling lines. In the sub coupling lines, the portions of the main line 1—1 are wired or laid in parallel to the sub coupling lines in wiring lines 1-2 and 1-3 at the directional couplers C1 and C2. Assumptively, a signal propagation delay time between the MC 10-1 and the far end of main line 1—1 is expressed by T1. Also, a propagation delay time at the sub coupling line of each of the couplers C1 and C2 is expressed by T2. There also exist partial lines of portions not constituting the directional couplers on the main line 1—1 but it is assumed that these partial lines are so short that their propagation delay time is negligible for simplification of explanation. In other words, given that T1=2×T2, the following description will be given.

The opposite ends of the main line 1—1 are designated by (A) and (B). The end (A) is close to the MC 10-1 and the end (B) is the remote open-end of the main line 1—1. Similarly, the opposite ends of the line 1-2 are designated by (C) and (D) and the opposite ends of the line 1-3 are designated by (E) and (F). Voltage waveforms at the individual points (A) to (F) are diagrammatically illustrated in FIGS. 4, 5 and 6.

Figure 5:
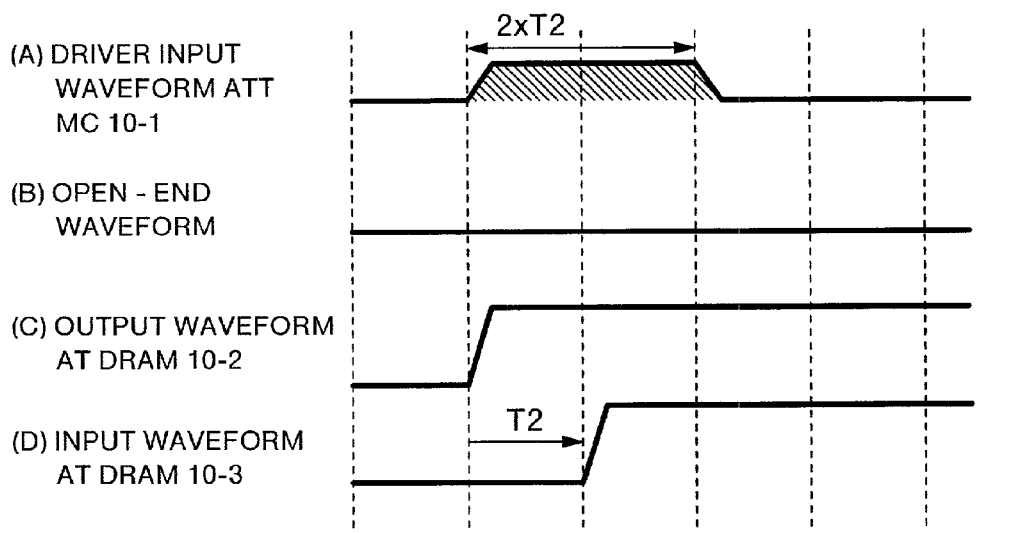
FIG. 5 is a timing chart of read from a DRAM 10-1 to the MC in the first embodiment.
Figure 6:
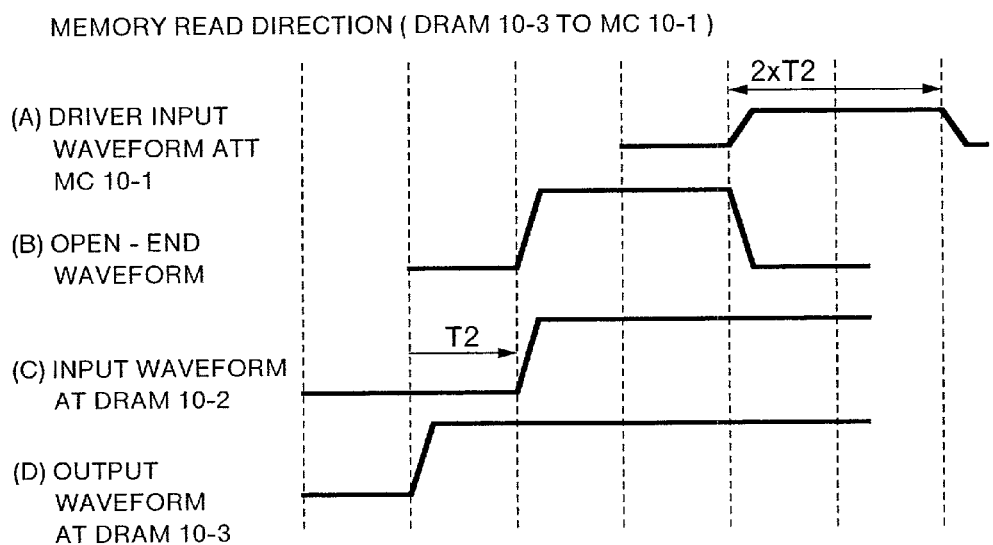
FIG. 6 is a timing chart of read from a DRAM 10-2 to the MC in the first embodiment.

FIG. 4 shows a signal state in which a data signal is transmitted (for write) from the MC 10-1, FIG. 5 shows a signal state in which a memory read signal is transmitted from the DRAM 10-2 to the MC 10-1, and FIG. 6 shows a signal state in which a memory read signal is transmitted from the DRAM 10-3 to the MC 10-1. In these figures, abscissa represents time and vertical dotted lines are drawn at intervals of T2. Ordinate represents signal voltage.

In FIG. 4, waveform (A) is an output waveform of the driver of MC 10-1, which waveform shifts from L state to H state. The driver of MC 10-1 has an output impedance equal to the impedance of the main line 1—1. Such a driver as above is particularly called a source impedance matching driver. The drive waveform shifting from L state to H state is of a divisional voltage by the impedance of driver and that of main line 1—1 and so a half the drive voltage is delivered. After having propagated for time T1 on the main line 1—1 to the right in the drawing, the drive signal reaches the remote end (B). In this phase, the voltage undergoes total reflection because of the open-ended (B) terminal and a forward wave is superimposed on a reflection wave to produce a doubled voltage.

After time T1 from the drive initiation, the reflection wave propagates on the main line 1—1 to the left and reaches the (A) end. Till then, time 2×T1 has elapsed following the drive initiation. Voltage in this phase is the superimposed voltage of the forward wave and reflection wave, equaling the drive voltage of the MC 10-1. The driver is in source impedance matching and therefore no reflection takes place at the driver, so that the signal does not repeat reflection but stably keeps the H state.

Next, the individual points of the wiring lines 1-2 and 1-3 will be noticed. By the forward wave flowing on the main line 1—1, a backward signal is generated in the coupler C1. Backward herein referred to means a direction inverse to the direction of the forward wave and corresponds to the end or terminal (C) in FIG. 3. In other words, backward crosstalk is generated. The signal generated in the (C) terminal direction is absorbed in the DRAM 10-2 in FIG. 3 and is not reflected. This is because the DRAM 10-2 terminates in the impedance equal to the characteristic impedance Zo of the line 1-2.

When the coupler is constructed of a strip line that is a wiring line surrounded by a metal plane, an induced voltage due to an inductance between the two lines cancels an induced voltage due to an electrostatic capacitance therebetween, with the result that no signal is generated at the forward end (D). Accordingly, so-called forward crosstalk does not occur. Thus, in with the directional coupler Cl in FIG. 4, backward crosstalk due to the forward wave on the main line 1—1 is generated at the terminal (C) whereas no forward crosstalk is generated at the terminal (D). The backward crosstalk generated by the coupler C1 has a length corresponding to time (=2×T2) for reciprocation over the coupler C1.

This pulse width is grounded on the following reasons.

The backward crosstalk is generated by the wavefront of the forward wave and is kept to be induced in the sub coupling line until the forward wave coming into the coupler goes out of it. Time T2 is required for the forward wave to propagate from entrance to exit of each coupler and time T2 is required for a signal generated near the exit of the sub coupling line to propagate through the sub coupling line, so that the signal is induced during the total of 2T2.

After T2 from the drive initiation, the forward wave traveling on the main line 1—1 reaches the coupler C2 and thereafter acts on the coupler C2 similarly to the coupler C1. As a result, a signal similar to the waveform (C) is induced at the terminal (E) of the DRAM 10-4. Of course, no reflection takes place at this terminal. As in the case of the terminal (D), the forward wave propagating through the coupler C2 does not induce any voltage at the terminal (F).

When the reflection wave is generated at the open-end (B) of the main line 1—1 after time T1, an inverse process proceeds. Since the (B) terminal is the open-end, the signal wave undergoes total reflection. The voltage amplitude of the reflection wave is the same as that of the forward wave and its travel direction is inversed. On the way to return to the MC 10-1 through the main line 1—1, the reflection wave first induces backward crosstalk at the coupler C2. Thus, a signal is induced at the terminal (F) that is backward as viewed from the reflection wave on the main line 1—1. Given that the wiring resistance does not exist and the wave traveling on the main line 1—1 is not distorted, the reflection wave on the main line 1—1 induces, at the terminal (F), the same waveform as that at the terminal (C). The timing coincides with the expiration of time T1, measured by starting with the initiation of signal transmission by the MC 10-1, at which the reflection wave is generated. The pulse width of the wave at the terminal (F) is twice the T2. Obviously, this reflection wave does not induce any voltage at the forward terminal (E) through the coupler C2.

After time T1+T2, the reflection wave on the main line 1—1 comes into the coupler Cl to induce backward crosstalk at the terminal (D) in a similar manner. This pulse width is also twice the T2.

As described above, the signal traveling on the main line 1—1 from the MC 10-1 provides the forward wave and the reflection wave generated at the terminal (B) that generate backward crosstalk in the couplers C1 and C2, respectively. Since the couplers C1 and C2 perform selective signal generation depending on the directions of the forward and reflection waves, the thus generated signals do not superimpose mutually and they do not act as noise on each other. Consequently, pulses each having a width of twice the T2 that equals propagation delay time for reciprocation over each of the couplers C1 and C2 are generated at the individual terminals (C) to (F) of the DRAM's 10-2 to 10-5, demonstrating that the pulse generation as above coincides with that in JP-A-7-141079, having comparable signal waveform quality. Signals are generated in order of timing at the terminals (C), (E), (F) and (D), indicating that the terminal (C) of DRAM 10-2 is the temporally closest to the MC 10-1 and the second terminal (D) of DRAM 10-3 is the temporally remotest from the MC 10-1. Signal propagation delay times from the MC 10-1 to the individual DRAM's 10-2 to 10-5 are indicated by the following equations (1) to (4), respectively.

$$\text{Signal propagation delay time from MC10-1 to DRAM10-2}(C)=0 \tag{1}$$

$$\text{Signal propagation delay time from MC10-1 to DRAM10-3}(D)=T1+T2 \tag{2}$$

$$\text{Signal propagation delay time from MC10-1 to DRAM10-4}(E)=T2 \tag{3}$$

$$\text{Signal propagation delay time from MC10-1 to DRAM10-5}(F)=T1 \tag{4}$$

Accordingly, in individual events, signals arrive after the delay times indicated by equations (1) to (4).

It will be seen that by connecting the two terminated DRAM's 10-2 and 10-3 to the opposite ends of the directional coupler Cl and the two terminated DRAM's 10-4 and 10-5 to the opposite ends of the directional coupler C2, as shown in FIGS. 1 and 3, signal transmission from the MC 10-1 to the DRAM's 10-2 to 10-5 can be achieved.

Next, by making reference to FIGS. 5 and 6, signal transmission from the DRAM's 10-2 to 10-5 to the MC 10-1 in the read direction of memory will be considered. Waveforms participating in transfer from the DRAM 10-2 to the MC 10-1 developing at the individual points are illustrated in FIG. 5 and waveforms participating in transfer from the DRAM 10-3 to the MC 10-1 are illustrated in FIG. 6. Waveforms participating in transfer from the DRAM's 10-4 and 10-5 to the MC 10-1 are grounded on the same mechanism as that in FIGS. 5 and 6 and will not be described.

Firstly, in FIG. 5, the signal state changes from L state to H state at DRAM 10-2 (C) and a pulse is delivered therefrom. Then, after time T2, the signal reaches the terminal (D). The DRAM 10-3 (D) has an input impedance equal to the characteristic impedance of line and no reflection occurs. The coupler C1 induces backward crosstalk in the main line 1—1. The duration of this pulse equals propagation delay time (= 2×T2) for reciprocation over the coupler as in the case FIG. 4. No forward crosstalk takes place on the main line 1—1 and so, no signal is induced at the terminal (B). Consequently, even when the terminal (B) of the main line 1—1 is open-end, crosstalk can be generated at the MC 10-1 by driving the pulse signal from the DRAM 10-2. This signal has the same pulse width as that in the prior art, JP-A-7-141079.

Transfer from the DRAM 10-3 (D) to the MC 10-1(A) in FIG. 6 is an inverse generation process. A pulse from the DRAM 10-3 (D) reaches the terminal (C) after time T2. Backward crosstalk is induced in the coupler C1 and it propagates on the main line 1—1 toward the terminal (B). After time T2 following the drive initiation at the terminal (D), the backward crosstalk generated by the coupler C1 reaches the terminal (B). The backward crosstalk undergoes total reflection at that end and travels inversely on the main line 1—1. After time T2+T1 following the drive initiation, the backward crosstalk reaches the MC 10-1. In FIG. 6, the pulse reaching the MC 10-1 (A) also has a width that is twice the T2, equaling the pulse width in FIG. 4.

Signal propagation delay times from the individual DRAM's 10-2 to 10-5 to the MC 10-1 during read operation are the same as those in FIG. 4. Namely, they are indicated by the following equations (5) to (8).

$$\text{Signal propagation delay time from DRAM } \mathbf{10\text{-}2}(C) \text{ to } MC\mathbf{10\text{-}1} = 0 \quad (5)$$

$$\text{Signal propagation delay time from DRAM}\mathbf{10\text{-}3}(D) \text{ to } MC\mathbf{10\text{-}1} = T2+T1 \quad (6)$$

$$\text{Signal propagation delay time from DRAM}\mathbf{10\text{-}4}(E) \text{ to } MC\mathbf{10\text{-}1} = T2 \quad (7)$$

$$\text{Signal propagation delay time from DRAM}\mathbf{10\text{-}5}(F) \text{ to } MC\mathbf{10\text{-}1} = T1 \quad (8)$$

Accordingly, in individual events, signals arrive after the delay times indicated by the above equations. These equations (5) to (8) are equal to the equations (1) to (4), demonstrating that for both the write operation and the read operation, the propagation delay time between the MC 10-1 and the DRAM's 10-2 to 10-5 is the same. This is comparable to the use of the prior art, exhibiting characteristics important for timing design in the memory system. In other words, the conventional timing design method as it is can be followed by the present invention, leading to reduction in the number of steps in development.

Figure 2:
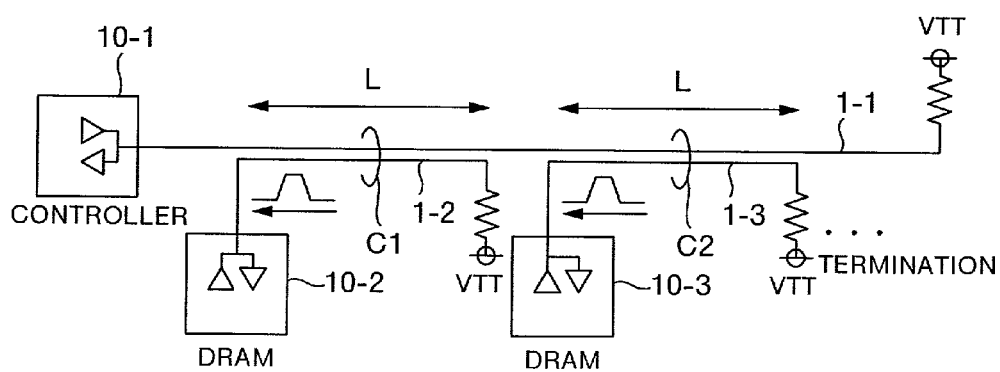
FIG. 2 is a schematic block circuit diagram showing an example of construction of the prior art system.

It will be seen that a bus for bi-directional signal transmission can be constructed by connecting the four DRAM's to the bus and using only two couplers. Through this, the packaging area of DRAM's can be halved as compared to the prior art of FIG. 2 to ensure high-density packaging. More particularly, the prior art of JP-A-7-141079 faces a problem that the directional couplers are aligned in sequence as shown in FIG. 2 and the pitch between the DRAM's 10-2 to 10-5 cannot be less than the length of the coupler. But, by making the main line the open-end, placing the driver of MC 10-1 in source impedance matching and using the terminated DRAM's 10-2 to 10-5 as shown in FIG. 1 or 3, the same line length can be used for the same main line to connect the doubled number of DRAM's, thereby permitting high-density packaging in the system.

Next, the signal transmission is confirmed through simulation. The simulation will be described with reference to FIGS. 7 to 12.

Figure 7:
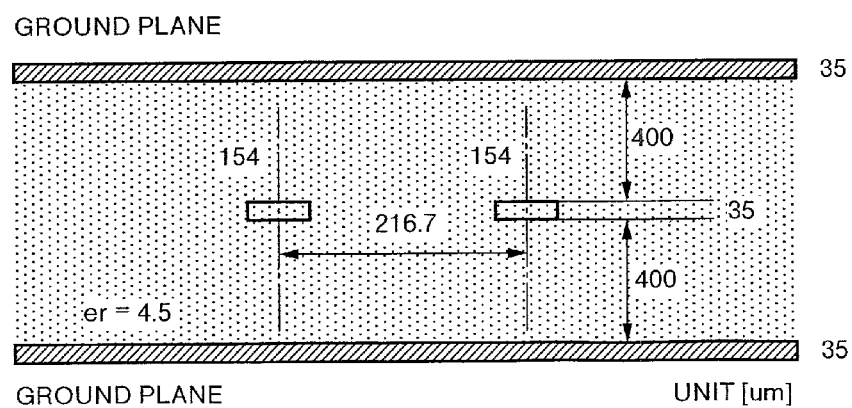
FIG. 7 is a sectional diagram showing a first embodiment of wiring mode according to the invention.

Referring first to FIG. 7, a first embodiment of the wiring mode according to the invention will be described. In FIG. 7, the directional couplers are illustrated in sectional form. Various shapes of the coupler can be considered in accordance with requirements imposed by the system. In the general technique, however, a material of FR-4 for a printed circuit board is used to attain a wiring line width (W=154 $\mu$m) and a wiring pitch (S=216.7 $\mu$m) in personal computers (PC's) and PC servers. The above data is subjected to an electromagnetic field analysis to obtain electrical characteristics between wiring lines as below.

$$\begin{aligned}&\text{Capacitance matrix between two lines CMATRIX}\\&\text{(F/um)= } 1.446e\text{-}16 \quad -6.644e\text{-}17 \quad -6.644e\text{-}17\\&1.446e\text{-}16\end{aligned} \quad (9)$$

$$\begin{aligned}&\text{Inductance matrix between two lines LMATRIX}\\&\text{(H/um)= } 4.487e\text{-}13 \quad 2.062e\text{-}13 \quad 2.062e\text{-}13\\&4.487e\text{-}13\end{aligned} \quad (10)$$

$$\begin{aligned}&\text{Characteristic impedance matrix Real part= } 6.272e\text{+}01\\&2.882e\text{+}01 \; 2.882e\text{+}01 \; 6.272e\text{+}01\end{aligned} \quad (11)$$

$$\begin{aligned}&\text{Imaginary part= } -3.336e\text{-}01 \; -1.694e\text{-}02 \; -1.694e\text{-}02\\&-3.336e\text{-}01\end{aligned} \quad (12)$$

Consequently, effective impedance Zeff of the two lines was 55 Ω. In the above equations, "e" represents power of base of 10.

Further, in the backward crosstalk coefficient, $$\begin{aligned}&\text{Real part= } 1.000e\text{+}00 \quad 2.433e\text{-}01 \quad 2.433e\text{-}01\\&1.000e\text{+}00\end{aligned} \quad (13)$$

$$\begin{aligned}&\text{Imaginary part= } 000e\text{+}00 \quad 1.441e\text{-}03 \quad 441e\text{-}03\\&0.000e\text{+}00\end{aligned} \quad (14)$$

It will therefore be seen that when a signal of 1V is incident, a backward crosstalk signal of 0.2433V is induced.

Figure 8:
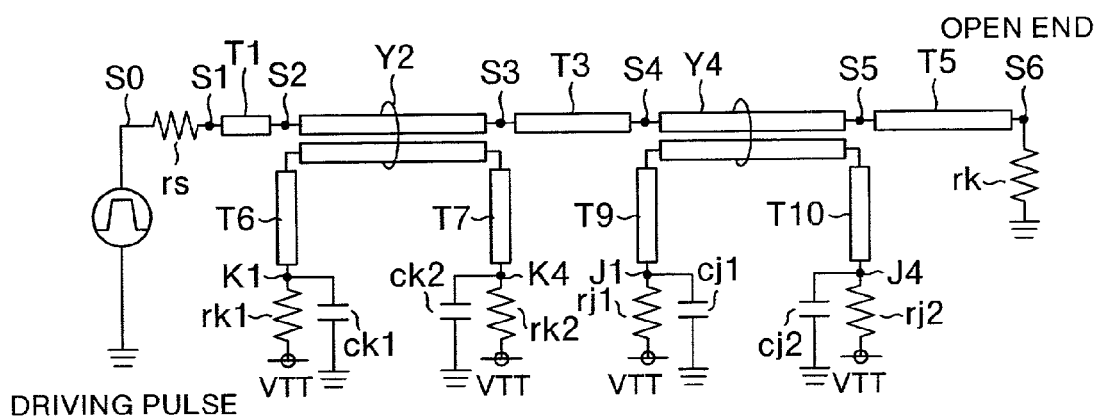
FIG. 8 shows an equivalent circuit for write simulation from the MC to the DRAM in the first embodiment of the bus system.

By using these couplers, write data waveforms from the MC 10-1 to the DRAM's 10-2 to 10-5 shown in FIG. 3 are simulated in accordance with an equivalent circuit as shown in FIG. 8. A simulator used is a SPICE (Simulation Program for Integrated Circuit Emphasis) for circuit analysis. As an equivalent circuit of the driver of MC 10-1, a pulse voltage source and a resistor rs are used. Known transmission line models T1, T3 and T5 are connected to set up an equivalent circuit of the main line 1—1, known lossy coupled transmission line models Y2 and Y4 are connected to set up the directional couplers and one end S6 of the transmission line T5 is terminated by a resistor rk of high resistance. The resistor rk has a high resistance of 100 kΩ and can therefore be regarded as an open-end. The terminals (A) and (B) in FIG. 3 correspond to terminals S1 and S2 in FIG. 8.

The DRAM's 10-2 to 10-5 are represented by parallel connections of termination resistors rk1, rk2, rj1 and rj2 and input electrostatic capacitors rk1 and ck1, rk2, cj1 and cj2. The ends (C) and (D) in FIG. 3 correspond to nodes K1 and k4 in FIG. 8 and the ends (E) and (F) in FIG. 3 correspond to nodes J1 and J4. Termination potential is indicated by Vtt. Constants of these elements will be shown as below.

$$\text{VPULSE: amplitude=1.8V, rise time=0.1ns} \quad (15)$$

$$\text{rs=55}\Omega \quad (16)$$

$$\begin{aligned}&\text{t1, t3, t5, t6, t8, t9, t10: characteristic impedance}\\&z0=55\Omega, \text{td=1.0 ns}\end{aligned} \quad (17)$$

$$\text{Y2, Y4: wiring line length=40 mm} \quad (18)$$

$$\text{rk=100 K}\Omega \quad (19)$$

$$\text{rk1, rk2, rj1, rj2=55}\Omega \quad (20)$$

$$\text{Vtt=0.9V} \quad (21)$$

$$\text{ck1, ck2, cj1, cj2=0.1 pF} \quad (22)$$

Figure 9:
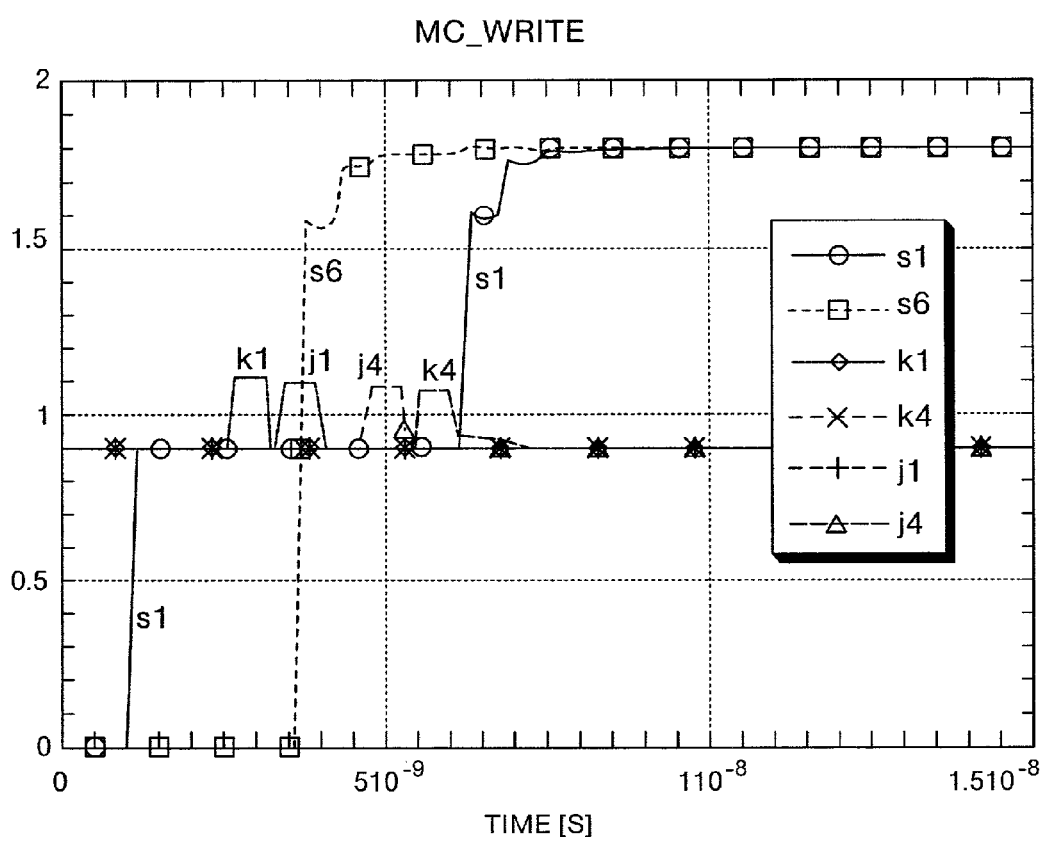
FIG. 9 is a time chart showing write data waveforms from the MC to the DRAM in the first embodiment of the bus system.

Resulting simulation waveforms are illustrated in FIG. 9. This is an example where Vtt=0.9V. Like FIG. 4, smart rectangular pulses are generated at the terminals K1, K4, J1 and J4 corresponding to the DRAM's 10-2 to 10-5, indicating that any great disturbance does not take place. It will be noted that while the amplitude of drive pulse is 0.9V, the amplitude of crosstalk is 108 mV to 200 mV and the amplitude levels at the terminals K1, J1, J4 and K4 decrease slightly gradually in sequence owing to the wiring resistance of the main line 1—1. A signal of about 100 mV is at a voltage level that can be discriminated sufficiently even by a semiconductor using a C-MOS. It will also be seen that the time sequence of occurrence of crosstalk at the terminals K1, J1, J4 and K4 is the same as that in FIG. 4.

Figure 10:
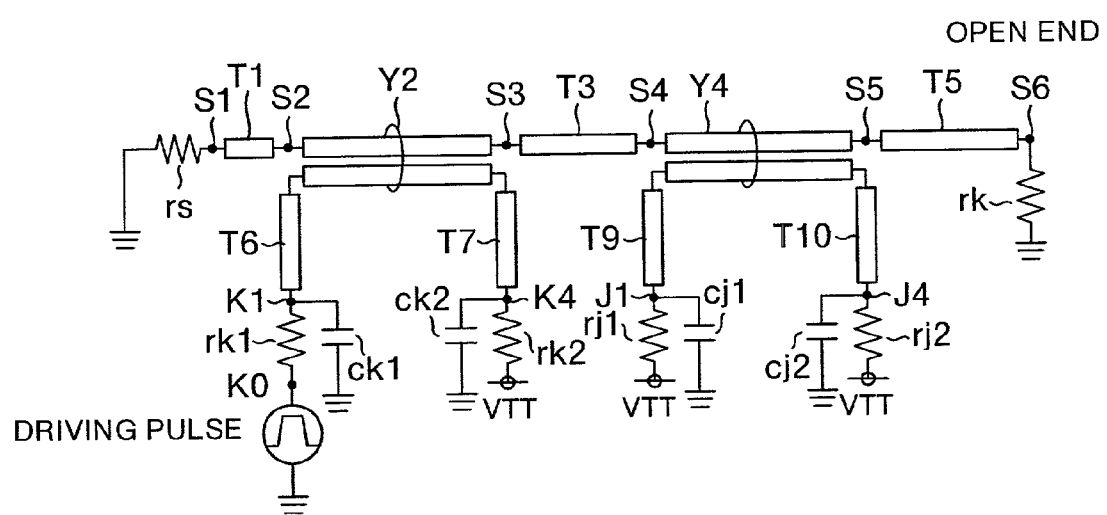
FIG. 10 shows an equivalent circuit for read simulation from the DRAM 10-1 to the MC in the first embodiment of the bus system.
Figure 11:
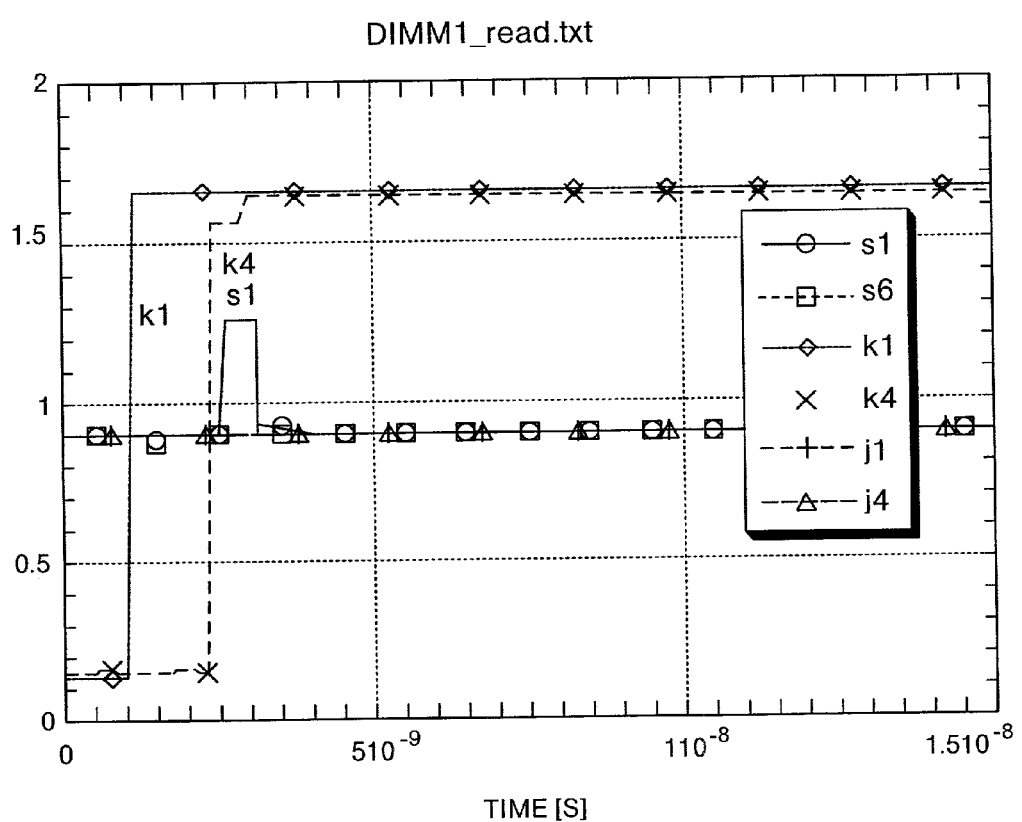
FIG. 11 is a time chart showing read data waveforms from the DRAM 10-1 to the MC in the first embodiment of the bus system.

Next, waveforms during the signal transmission (read) from the DRAM 10-2 to the MC 10-1 will be described with reference to FIGS. 10 and 11. Like FIG. 8, FIG. 10 shows an equivalent circuit. A voltage source serving as a read signal is connected to a point K0 corresponding to the DRAM 10-2 in FIG. 1. The impedance of the driver of DRAM 10-2 is represented by rk1 and is set to 10Ω that is smaller than the wiring impedance Zo (=55Ω) with the aim of increasing the signal amplitude of pulse.

A resistor rs having a resistance of 55Ω equal to the characteristic impedance Zo of the wiring is connected to a point S1 on main line corresponding to the MC 10-1. Other circuit constants are the same as those in FIG. 8. Waveforms obtained through this circuit analysis are illustrated in FIG. 11. A pulse of 368 mV reaches the S1 point of the MC 10-1 and waveforms leading to noise are hardly seen at other points. This waveform is almost equal to that in FIG. 5.

Figure 12:
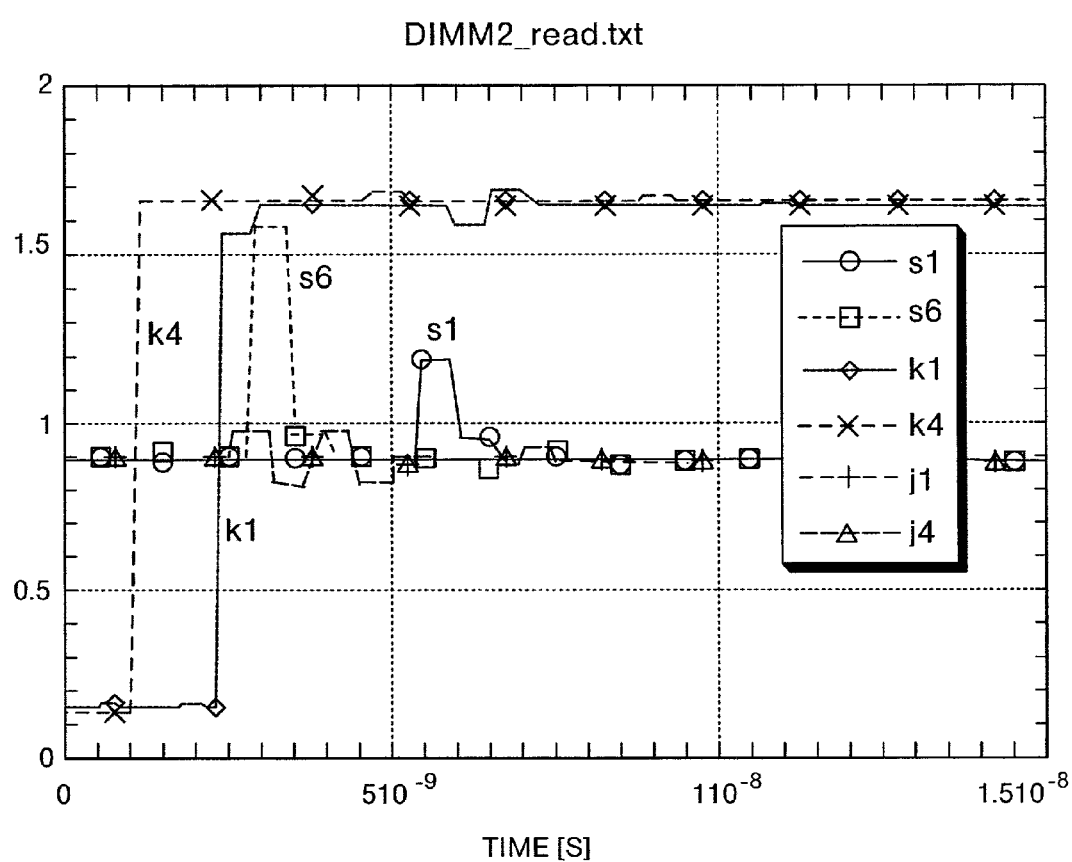
FIG. 12 is a time chart showing read data waveforms from the DRAM 10-2 to the MC in the first embodiment of the bus system.

Next, signal waveforms from the DRAM 10-3 to the MC 10-1 are illustrated in FIG. 12. In comparison with the equivalent circuit of FIG. 10, the pulse voltage source is connected to the resistor rk2 and the resistor rk1 is connected to the termination voltage source VTT through the characteristic impedance as in the case of FIG. 8. Like the resistor rk1 in FIG. 10, the resistor rk2 has a low impedance of 10Ω. Resulting waveforms are illustrated in FIG. 12.

In FIG. 12, when a drive pulse from the terminal K4, indicated by dotted line, passes through the coupler Y2 of FIG. 10, crosstalk is generated on the main line. The pulse traveling on the main line is reflected at the terminal S6. Since the reflection is total reflection, the amplitude of the pulse is doubled. The reflected pulse reaches the terminal S1, resulting in a pulse of 302 mV amplitude. The time for arrival is longer than that in FIG. 11 and is equal to the delay time between the terminals S1 and K4 in FIG. 9. A noise of about 80 mV is superimposed on a waveform at the terminal J4 but this does not matter because this transfer is read transfer from the DRAM 10-3 to the MC 10-1 and the DRAM 10-5 does not utilize this signal.

The read waveforms from the DRAM's 10-4 and 10-5 are similar in mechanism. Accordingly, read data can be transferred to the MC 10-1. Further, it will be seen that the propagation delay time in this case is the same as that in FIG. 9.

Figure 13:
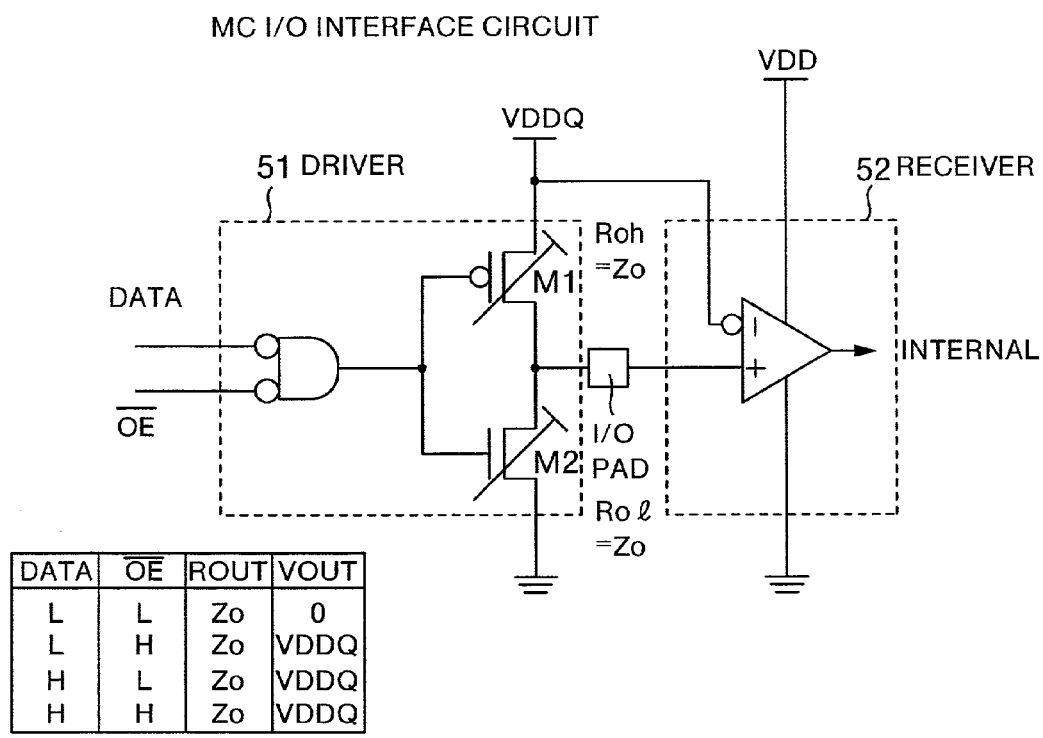
FIG. 13 is a circuit diagram showing an I/O circuit of the MC in the first embodiment of the bus system.
Figure 14:
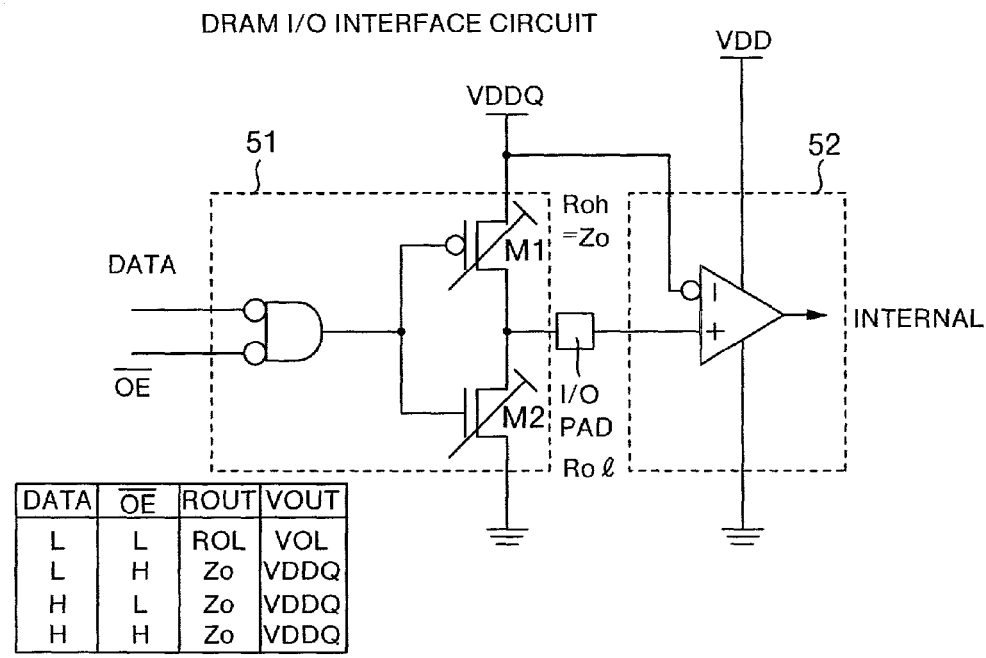
FIG. 14 is a circuit diagram showing an I/O circuit of the DRAM in the first embodiment of the bus system.

Referring now to FIGS. 13 and 14, the I/O circuits of the MC 10-1 and DRAM's 10-2 to 10-5 will be described.

The I/O circuit of MC 10-1 is shown in FIG. 13. In the figure, the driver of the MC 10-1 designated by reference numeral 51 and a receiver 52 are connected to each other at the same potential through an input/output terminal (I/O PAD). The driver 51 is in source impedance matching to have an impedance equal to the characteristic impedance of the wiring line connected with the driver regardless of whether data is transmitted or not. Transistors in the final stage of the driver 51 are designated by M1 and M2. The transistors M1 and M2 are totem pole connected. The transistor M1 is a P-MOS transistor connected to the output terminal (I/O PAD) and a power supply VDDQ. The transistor M2 is an N-MOS transistor connected to the output terminal and ground (VSS). Each of the two transistors M1 and M2 has the impedance that can be changed by changing the gate width of the transistor. Therefore, by adjusting the transistor gate width with an impedance adjusting circuit not shown in FIG. 3, the impedance can be matched to the characteristic impedance of the main line 1—1.

The MC 10-1 controls the transistors M1 and M2 in accordance with data to be delivered. When output data is designated by DATA and an output enable signal is designated by OE, the driver to be owned by the MC 10-1 of FIG. 1 has a driver characteristic as shown at table in FIG. 13. More particularly, only when DATA=L (logical low) and OE=L, the transistor M2 is turned on to deliver L signal. In other states, the transistor M1 is turned on. As a result, regardless of either transmission or reception of data, the impedance of the driver matches the characteristic impedance of the main line. The driver 51 is connected with the main line having the open-end and hence, with the construction as above, any current is not consumed unless the L signal is driven.

Turning now to the receiver 52, this receiver has a hysteresis characteristic for discrimination of signals generated by the directional coupler. More particularly, when the signal coming into the directional coupler shifts from L (logical low) to H (logical high), a pulse of positive polarity is generated by the receiver 52 and when the signal shifts from H to L, a pulse of negative polarity is generated. Thus, the hysteresis characteristic ensures one method for discrimination between two signals of different polarities.

When the driver of MC 10-1 in FIG. 13 is connected to the bus in FIG. 1, the read data read by the MC 10-1 generates a pulse of positive/negative polarity with respect to potential in H state outputted by the driver 51. The reasons for this are as follows. In the directional coupler, DC coupling does not take place between the two lines and so, an AC pulse is superposed on the output potential of the driver 51 in MC 10-1 regardless of the DC level of the drive voltage outputted by DRAM. And then, during read, data is by no means delivered out of the driver and the terminal potential on the main line equals VDDQ of H state.

Accordingly, in the receiver 52, the signal from the I/O PAD is compared with the H potential of driver 51, that is, VDDQ. This accounts for the fact that a circuit of receiver 52 for reception of the signal is operated by VDD higher than VDDQ and for example, if VDD=2.5V for VDDQ=1.8V, the receiver 52 can be implemented with a C-MOS without causing any problem.

As described above, when having the I/O circuit as shown in FIG. 13, the MC 10-1 of FIG. 1 can transmit and receive the signal stably.

Next, an example of the I/O circuit of each of the DRAM's 10-2 to 10-5 will be described with reference to FIG. 14.

The I/O circuit of each of the DRAM's 10-2 to 10-5 is substantially the same as that of the MC 10-1 in FIG. 13 excepting for a driver 51'. The transistor M2 has an impedance lower than that of the wiring line. Other components are identical to those of FIG. 13.

The above construction is grounded on the following reasons. The line on the DRAM side is terminated at the opposite ends when data is inputted to the DRAM. When delivering data, the other DRAM is placed in matching termination condition. In other words, no reflection wave returns from the remote end. This differs from the condition that the main line connected to the MC 10-1 has the open-end. Therefore, the driver 51' need not be terminated. Namely, the driver 51' need not be in source impedance matching. Accordingly, the signal generated by the coupler can be made to be higher by making the drive pulse higher. To this end, the impedance of the transistor M2 is lowered to maintain the large amplitude. The output impedance of the driver 51' can of course be matched to the characteristic impedance of the line. In that case, the signal amplitude of the drive pulse is decreased but it does not matter if the receiver of the MC 10-1 can discriminate the data. In this case, the I/O circuit is constructed identically to FIG. 13. When receiving data, the driver delivers H state to make its impedance match with the characteristic impedance of the main line. As a result, both the drivers 51' of two DRAM's 10-2 and 10-3 connected to the same line deliver H output but this potential equals VDDQ and no consumption current flows under this condition. In other words, during H drive or HiZ state of data, the consumption current does not flow. With this construction, no current is consumed unless L signal is driven and the same power saving effect as that with the main line of FIG. 13 can be obtained.

Even when the potential on the main line assumes VDDQ during reception as in the case of FIGS. 13 and 14, the signal amplitude generated by the directional coupler does not change. Accordingly, even with the MC 10-1 placed in H state, L state or HiZ state, a binary signal can be delivered under the condition that the output impedance matches the impedance of the wiring line and therefore, even when the main line has the open-end, no reflection takes place at the driver and a less distorted drive pulse can be delivered. Further, by making the driver 51' of each of the DRAM's 10-2 to 10-5 have a low impedance only in L state, the signal amplitude can be maintained and the waveform cannot be distorted. Therefore, data can be transmitted/received stably at a high speed.

Figure 15:
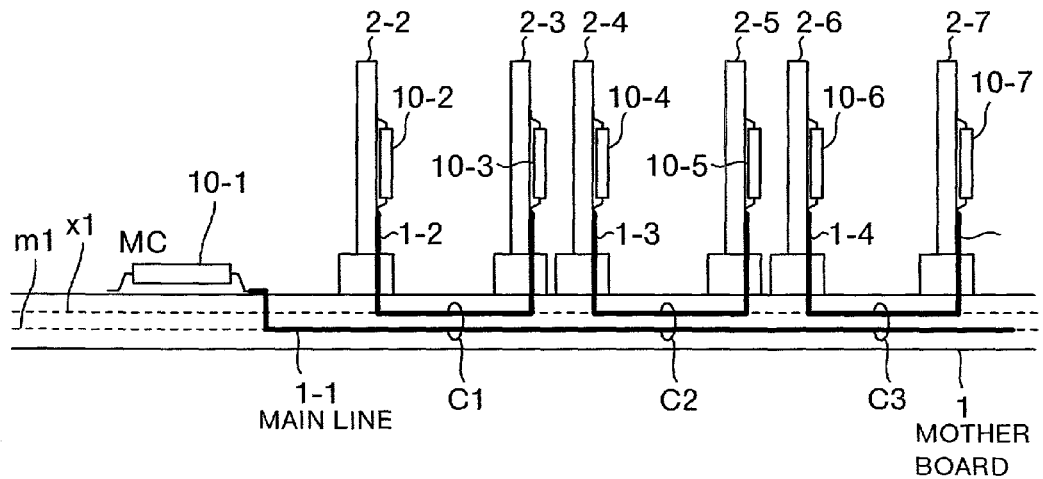
FIG. 15 is a sectional diagram showing a first embodiment of packaging according to the invention.

Referring now to FIG. 15, a first embodiment of packaging when the system is packaged in a printed circuit board will be described. Memory modules 2—2 to 2-7 carry the DRAM's 10-2 to 10-7, respectively. A mother board 1 carries the MC 10-1 and the memory modules 2—2 to 2-7. The memory modules 2—2 to 2-7 are connected to the mother board 1 by connectors. In the mother board 1, solid line represents a wiring layer for carrying parts and dashed lines m1 and x1 represent inner signal line layers.

In FIG. 15, the main line 1—1 from the MC 10-1 is wired straightly from right to left in the inner wiring layer m1. In case the main line 1—1 has to run around through-holes for connector lead wiring and power supply pins, it may be curved. The main line 1—1 cooperates with parts of lines 1-2 to 1-4 spaced apart from the main line in parallel therewith to form couplers C1 to C3. Stub lines to DRAM's are connected to the opposite ends of the sub coupling line of each of the couplers C1 to C3. The couplers C1 to C3 are aligned sequentially in relation to the main line 1—1 without overlapping each other. With this wiring mode, wiring associated with the individual memory modules 22 to 2-7 can be laid in the same wiring density.

The main line 1—1 terminates in the open-end at the right end (remote end) in FIG. 15.

In order to carry out data transmission/reception between the MC 10-1 and the DRAM's 10-2 to 10-7, a forward wave on the main line 1—1 and backward crosstalk due to the couplers C1 to C3 are utilized for the DRAM's 10-2, 10-4 and 10-6 and a reflection wave at the remote end and its backward crosstalk signal are utilized for the DRAM's 10-3, 10-5 and 10-7.

With the construction as above, a doubled number of memory modules 2—2 to 2-7 can be connected over the same length of the main line 1—1 as compared to the prior art system of FIG. 2. In FIG. 15, the two inner layers are used to form the directional couplers but the same effects can be attained by using two adjacent wiring lines in one layer. In that case, the number of inner layers can be reduced from two to one but the wiring density per layer is doubled. Thus, a choice can be made depending on requirements imposed by the system.

Of the memory modules 2—2 to 2-7 to be carried in FIG. 15, a particular memory module will not be carried depending on the system configuration. In that case, in order to suppress reflection generated at a vacant memory module, a termination module carrying a resistor for making the wiring line matching-terminate in the termination power supply must be inserted. The termination power supply and the memory modules 2—2 to 2-7 are at the same potential and the termination resistance equals the impedance of each of the DRAM's 10-2 to 10-7. Obviously, the characteristic impedance of the wiring in the termination module is set to be equal to the impedance of the memory module. By constructing the termination module in this manner and inserting it in the connector of the vacant memory module, reflection noise due to the wiring can be eliminated and bus operation can be accomplished stably.

A second embodiment of packaging will be described with reference to FIG. 16.

The present embodiment intends to package memory modules in higher density than that in the first embodiment of the wiring mode by utilizing the technique disclosed in the previously described U.S. Ser. No. 09/569,876 filed May 12, 2000 by the present applicant.

In U.S. Pat. No. 5,638,402 (JP-A-7-141079), there arises a problem that the directional couplers are aligned sequentially and so the pitch between the memory modules 2—2 to 2-9 carried in the mother board 1 cannot be less than the length of the coupler.

Contrary to FIG. 15, in the construction of the present embodiment, the wiring of the main line 1—1 is led in a signal layer m1 to the right in the drawing as viewed from the MC 10-1 and is relayed at the right end to a signal line layer m2 via a through-hole so as to run to the left, ultimately being opened at the remotest end.

The main line 1—1 in signal layer m1 cooperates with a wiring line 1-2 between DRAM's 10-2 and 10-4 and a wiring line 1-4 between DRAM's 10-6 and 10-8 to form couplers C1 and C3, respectively. The folded or turned-round main line 1—1 in the signal layer m2 cooperates with a wiring line 1-5 between DRAM's 10-7 and 10-9 and a wiring line 1-3 between DRAM's 10-3 and 10-5 to form couplers C4 and C2, respectively.

The lines 1-2 and 1-4 constitute sub coupling lines in a signal line layer x1 and the lines 1-3 and 1-5 constitute sub coupling lines in the signal line layer x2. Accordingly, the couplers C1 and C3 are constructed of the wiring layers x1 and m1 and the couplers C2 and C4 are constructed of the wiring layers m2 and x2. Thus, the couplers C1 and C3 will be described as being constructed of upper layers and the couplers C2 and C4 will be described as being constructed of lower layers.

The couplers C1 to C4 are sequentially laid such that they have a constant characteristic impedance of wiring relative to the main line 1—1. Arrangement and wiring is such that data transfer between the MC 10-1 and each of the DRAM's 10-2 and 10-9 is carried out using backward crosstalk in any couplers. More particularly, for the DRAM's 10-2 and 10-6 connected to the couplers C2 and C4 in the upper layers, backward crosstalk is induced by a forward wave traveling on the m1 layer of main line 1—1 and for the DRAM's 10-9 and 10-5 connected to the couplers C4 and C2 in the lower layers, backward crosstalk is induced by a forward wave traveling on the m2 layer of main line 1—1. Then, for the DRAM's 10-3 and 10-7 connected to the couplers C2 and C4 in the lower layers, backward crosstalk is induced by a reflection wave traveling on the m2 layer of main line 1—1 and for the DRAM's 10-8 and 104, backward crosstalk is induced through the couplers C3 and C1 in the upper layers by a reflection wave traveling on the m1 layer of main line 1—1. In this manner, the components are so arranged as to generate backward crosstalk in any transfer operations.

Since the main line 1—1 serving as the sub coupling line constituting the couplers can be once folded from one layer to the other so as to form the directional couplers in the respective layers, the pitch between adjacent ones of the memory modules 2—2 to 2-9 can be approximately half the length of coupler wiring line of each of the directional couplers C1 to C4. As a result, the memory modules can be packaged in one mother board in high density. Specifically, the package density can be twice higher than that in the first embodiment of FIG. 15 and four times higher than that in the prior art of FIG. 2. Even with this construction, the coupling length necessary for coupling remains unchanged and the coupling level necessary for signal propagation can also remain unchanged, thus exhibiting the signal waveform quality comparable to that in JP-A-7-141079 of FIG. 2.

To explain, in the prior art disclosed in JP-A-7-141079, the directional couplers are aligned sequentially as shown in FIG. 2, raising a problem that the pitch between adjacent ones of the memory modules 2—2 to 2-4 carried in the mother board 1 cannot be less than the length of the coupler. But, by folding the main line as shown in FIG. 16, the pitch between adjacent ones of the memory modules 2—2 to 2-9 carried in the mother board 1 can be ¼ of the length of the coupler to permit high-density packaging in the system.

Figure 16:
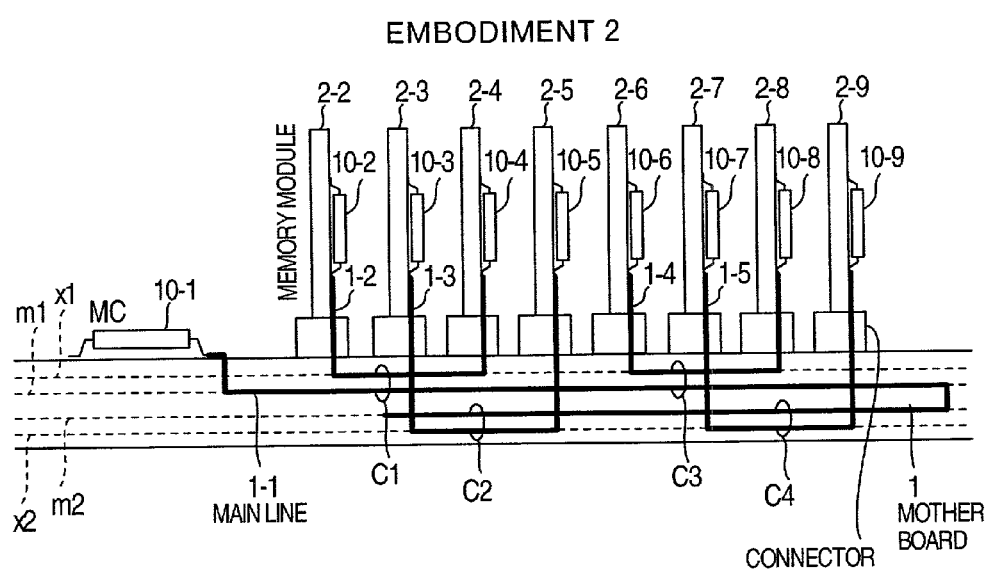
FIG. 16 is a sectional diagram showing a second embodiment of packaging.

In some applications, like the first embodiment of the wiring mode, one of the memory modules 2—2 to 2-9 to be carried is not carried depending on the system construction in the embodiment of FIG. 16. In that case, reflection is generated at a vacant memory module and for the purpose of suppressing the reflection, a termination module carrying a resistor for making the wiring line matching-terminate in the termination power supply must be inserted. The termination power supply is at the same potential as that of the memory modules 2—2 to 2-9 and the termination resistor has a resistance equal to the impedance of each of the DRAM's 10-2 to 10-9. Of course, the characteristic impedance of the wiring in the termination module is set to be equal to the impedance of the memory module. By constructing the termination module in this manner and inserting it in the connector of the vacant memory module, reflection noise due to the wiring can be eliminated and stable bus operation can be ensured.

Figure 17:
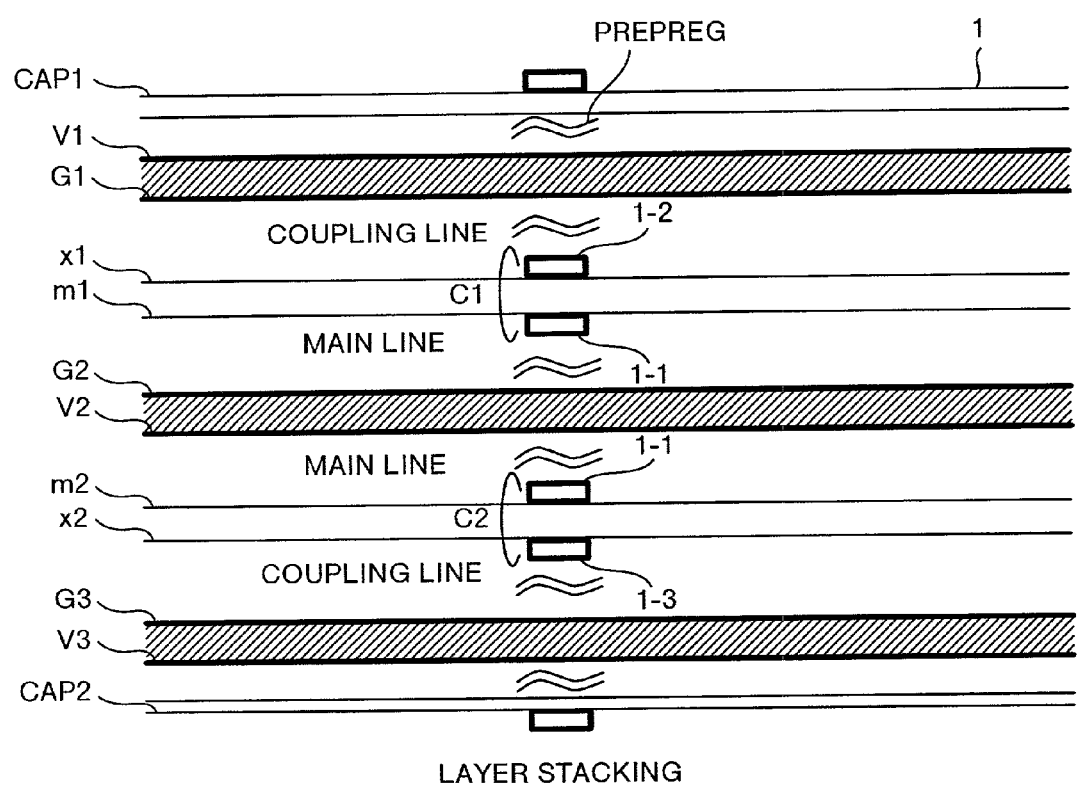
FIG. 17 is a sectional diagram showing a second embodiment of the wiring mode.

Referring now to FIG. 17, there is illustrated a second embodiment of the wiring mode showing an example of layer construction of mother board 1 adapted to the embodiment of FIG. 16. FIG. 17 is a longitudinal sectional view in a direction vertical to the main line 1—1 in the mother board 1 of FIG. 16. In this example, starting from the uppermost layer of CAP1 layer, a power supply layer (V1), a ground layer (G1), a signal layer (x1), a signal layer (m1), a ground layer (G2), a power supply layer (V2), a signal layer (m2), a signal layer (x2), a ground layer (G3), a power supply layer (V3) and a CAP2 layer are stacked. Generally, in the printed circuit board, cupper foiled plates having upper and lower sides covered with cupper are bonded with prepreg that is represented by two corrugated lines.

Of the directional couplers, the coupler C1 in FIG. 16 is formed of parallel wiring lines 1—1 and 1-2 laid in parallel in the overlying and underlying x1 and m1 layers. Similarly, the coupler C2 in FIG. 16 is formed of parallel lines 1—1 and 1-3 laid in parallel in the overlying and underlying layers m2 and x2. Here, main line 1—1 associated with the signal layer m1 and main line 1—1 associated with the signal layer m2 are formed of the same wiring line folded in FIG. 16.

A ground layer or power supply layer is positioned between the coupler formed of the x1 and m1 layers and the coupler formed of the m2 and x2 layers, functioning to prevent signal noise representing coupling between the directional couplers C1 and C2. With this construction, signal coupling between the couplers, that is, leakage noise can be reduced to ensure data transfer at a high speed.

Figure 18:
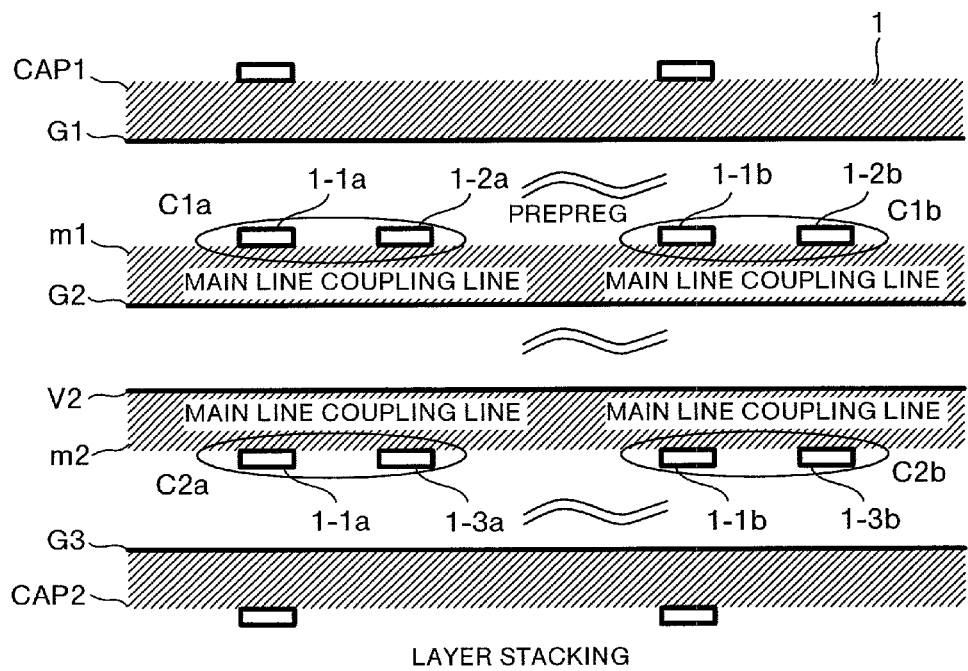
FIG. 18 is a sectional diagram showing a third embodiment of the wiring mode.

The wiring mode can be implemented according to a third embodiment as shown in FIG. 18. In the present embodiment, the couplers are arranged and coupled in the lateral direction in the longitudinal section. In the lateral direction as referred to herein, couplers are formed of the same layer. For example, a coupler C1a surrounded by an ellipse includes a main line 1-1a and a coupling line 1-2a and the main line 1-1a is folded to cooperate with a coupling line 1-3a so as to form a coupler C2a in the m2 layer. Similarly, a main line 1-1b of different signal bit couples with a coupling line 1-2b in the m1 layer to form a coupler C1b and the folded main line 1-1b cooperates with a coupling line 1-3b to form a coupler C2b. In order to reduce the noise level representing coupling between adjacent ones of the couplers C1a, C1b, C2a and C2b, a planar power supply layer is inserted between the layers and the signal lines 1-1a and 1-1b are distanced from each other. The couplers are constructed as above and advantageously, the number of layers can be reduced as compared to the embodiment of FIG. 17.

Figure 19:
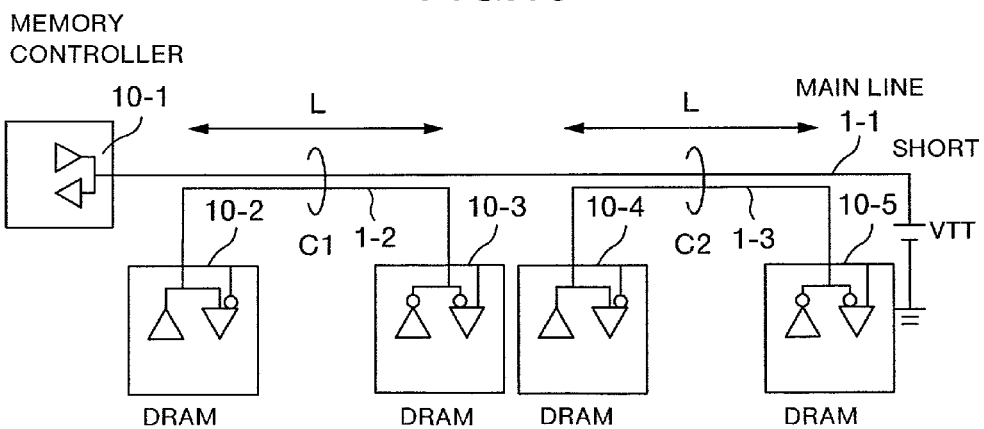
FIG. 19 is a schematic circuit diagram for explaining a second embodiment of the bus system according to the invention.

Referring now to FIG. 19, a second embodiment of the bus system will be described.

The present embodiment is directed to an example of construction in which the remote end of the main line 1—1 is short-circuited in contrast to the construction in FIG. 1.

Short-circuit herein referred to means that an impedance very lower than the impedance of the wiring is connected and in FIG. 19, the main line is connected to a power supply having an internal impedance of zero. With this connection, total reflection is generated at the remote end but in this case, the reflection coefficient is −1 and a reflection wave has a polarity different from that of a forward wave. Consequently, backward crosstalk generated at the DRAM's 10-5 and 10-3 also has a sign inverted to that in FIG. 1, having a negative logic relative to the DRAM's 10-2 and 10-4. In other words, the receiver of each of the DRAM's 10-3 and 10-5 is at negative logic as compared to that of each of the DRAM's 10-2 and 104. Similarly, the driver of each of the DRAM's 10-3 and 10-5 is also at negative logic.

The power supply to be short-circuited herein may be at either ground or VDDQ. The output impedance of the driver in the MC 10-1 is identical to the characteristic impedance of the wiring as in the case of the driver in the first embodiment (FIG. 1) but the output potential conditioned not to deliver data in HiZ state is of course set to be identical to this short-circuit potential. This is because if the above requirement is not satisfied, current flows out of the driver even when data transfer is not carried out to raise consumption power.

With the construction as above, signals of positive logic and negative logic can coexist for use. Even when the construction of the DRAM's 10-2 to 10-5 remains unchanged, a particular signal will sometimes be desired to have different polarities for even DRAM's and odd DRAM's depending on the system. For example, there arises such a desirability that the rise edge and fall edge of the clock signal inputted to the DRAM's are desired to be used. Of the connected DRAM's, DRAM's in the latter half in terms of temporal sequence as viewed from the MC are at negative logic and so, the phase of clock can be changed for the former half and the latter half. This can be used in time phase adjustment when the period of clock becomes shorter than the propagation delay time of the main line.

In the case of the construction in FIGS. 15 and 16, even modules can selectively be rendered to be at negative logic by making the wiring for a particular signal in the mother board open-ended or short-circuited even when the same modules are used. For example, when a chip select signal from the MC 10-1 is used in common to the DRAM's 10-2 and 10-3, the DRAM's 10-2 and 10-3 can be selected exclusively and the number of chip select signals can be reduced.

Further, in comparison with the main line 1—1 having its remote terminal open-ended, the electromagnetic field is shielded and as a result, electromagnetic wave confined in a space and radiated to a free space can be reduced. In other words, electromagnetic radiation noise can be reduced.

Figure 20:
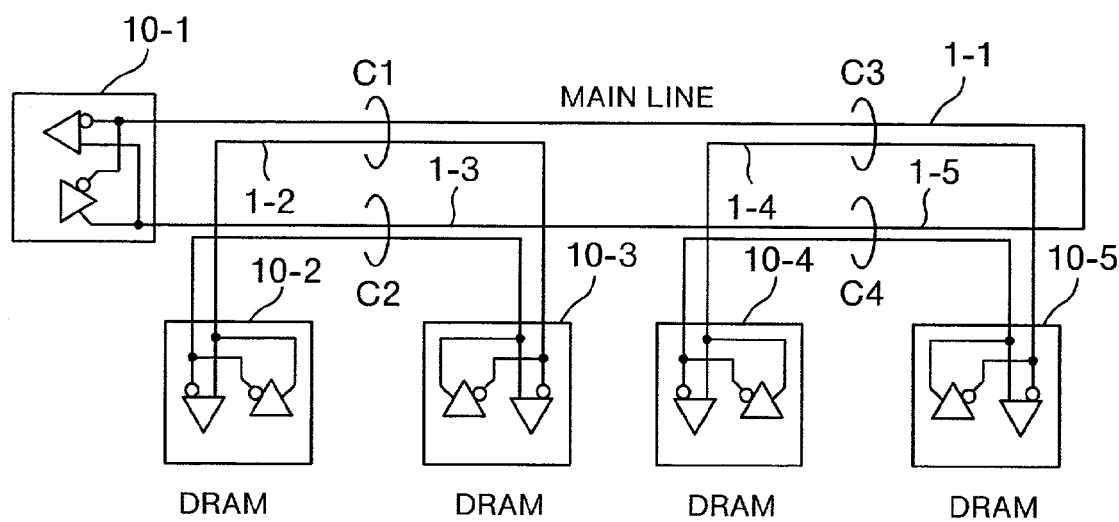
FIG. 20 is a schematic block circuit diagram of a third embodiment of the bus system.

Referring now to FIG. 20, a third embodiment of the bus system will be described.

In the present embodiment, the embodiment of FIG. 19 is applied to a differential signal. A differential driver in MC 10-1 is in source impedance matching and a main line 1—1 from the driver forms a ring. DRAM's 10-2 to 10-5 are connected to form couplers C1 to C4 together with the ring-formed main line 1—1. Differential I/O circuits in the DRAM's 10-2 and 10-4 are connected at positive logic terminal to the couplers C1 and C3 and connected at negative logic terminal to the couplers C2 and C4. On the other hand, differential I/O circuits in the DRAM's 10-3 and 10-5 are connected at positive logic terminal to the couplers C2 and C4 and are connected at negative logic terminal to the couplers C1 and C3. The clockwise wiring length from the MC 10-1 to the coupler C1 equals the counterclockwise wiring length from the MC 10-1 to the coupler C2 and the pulse reaches the couplers C1 and C2 at identical time. That is the case with the couplers C3 and C4.

The ring-formed main line 1—1 is folded at the right end in FIG. 20 and equipotential pulses of different polarities of the differential pulse from the MC 10-1 overlap each other at the folding point, thus giving rise to the same behavior as the short-circuiting in FIG. 19. More particularly, the drive pulse from the positive logic side of MC 10-1 propagates in the form of a forward wave of positive polarity from left to right to reach the folding point but when passing through the folding point, it meets a forward wave of negative polarity delivered out of the negative pole of the driver and traveling from left to right. These waveforms result in the same state as short-circuiting at the remote end from the MC 10-1.

With the construction as above, even DRAM's can selectively be operative at negative logic even for the differential signal.

Figure 21:
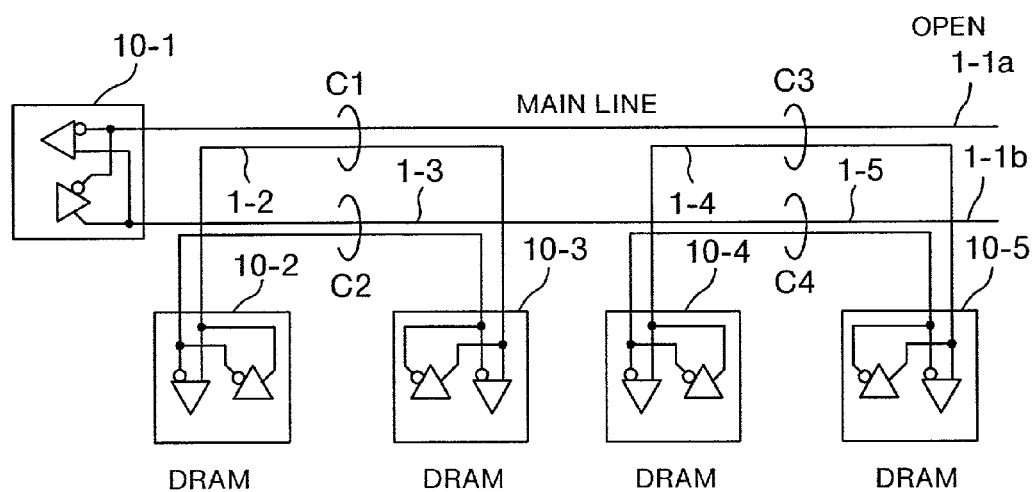
FIG. 21 is a schematic block circuit diagram of a fourth embodiment of the bus system.

Referring to FIG. 21, a fourth embodiment of the bus system will be described. In the present embodiment, the differential line is constructed as shown in FIG. 21.

Source lines 1-1*a* and 1-1*b* that constitute a differential signal wiring line from the MC 10-1 being in source impedance matching are constructed of two wiring lines having open-ends. Positive total reflection waves are generated at the open-ends and so inputs to receivers of DRAM's 10-3 and 10-5 are inverse to those in FIG. 20. More particularly, DRAM's 10-2 and 10-3 are connected to a coupler C1 at the positive logic terminal and they are connected to a coupler C2 at the negative logic terminal. With this construction, a differential signal being totally at positive logic can be transmitted.

By combining FIGS. 20 and 21 and making the main line take a ring form or have two open-ends for the same DRAM's in bus connection, even DRAM's can selectively be operated at either positive logic or negative logic. This can be accomplished by simply making the wiring lines in the mother board shown in FIGS. 15 and 16 short-circuited or open-ended without resort to any other parts. Accordingly, the degree of freedom of system design can be expanded.

Incidentally, in a memory module system using a DQS (data strobe) signal for latching a DQ (data) signal, for example, a DDR-SDRAM (Double Data Rate Synchronous DRAM), there arise a problem that latency of write data is long. This will be explained with reference to FIG. 22.

In a SSTL (Stub Series Terminated Logic) interface adopted in the DDR-SDRAM, the Hiz state is identical to termination voltage Vtt and reference voltage Vref of its receiver is also substantially identical to the terminating voltage Vtt, raising a problem that shifting or transition from Hiz state to L state or from Hiz state to H state can be detected.

Figure 22:
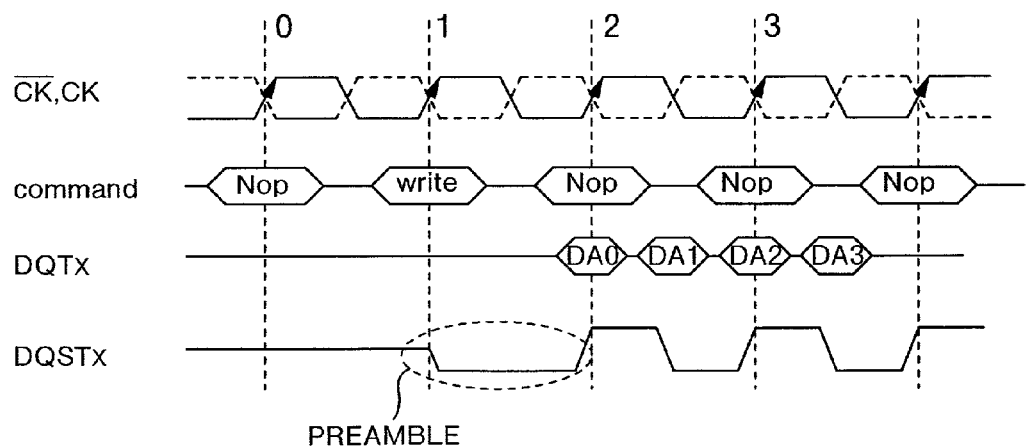
FIG. 22 is a timing chart of memory write in the prior art DDR-SDRAM.

To explain the problem more specifically with reference to FIG. 22, a command referenced to clock CK is issued and data is transmitted. For example, a write command is issued in stage 1 and write data (DAO) is transmitted from stage 2. A strobe signal DQS is once dropped from Hiz state to L state in stage 1 to drive a strobe signal for latching data in stage 2, with the result that one cycle wait is inserted in the data signal.

Reasons for this are as follows. The memory cannot detect the transition of the DQS from Hiz state to L state and cannot discriminate the transition of the DQS until the DQS changes from L to H. Therefore, for recognition of the DQS transition, the wait representing a preamble of one stage is inserted.

Figure 23:
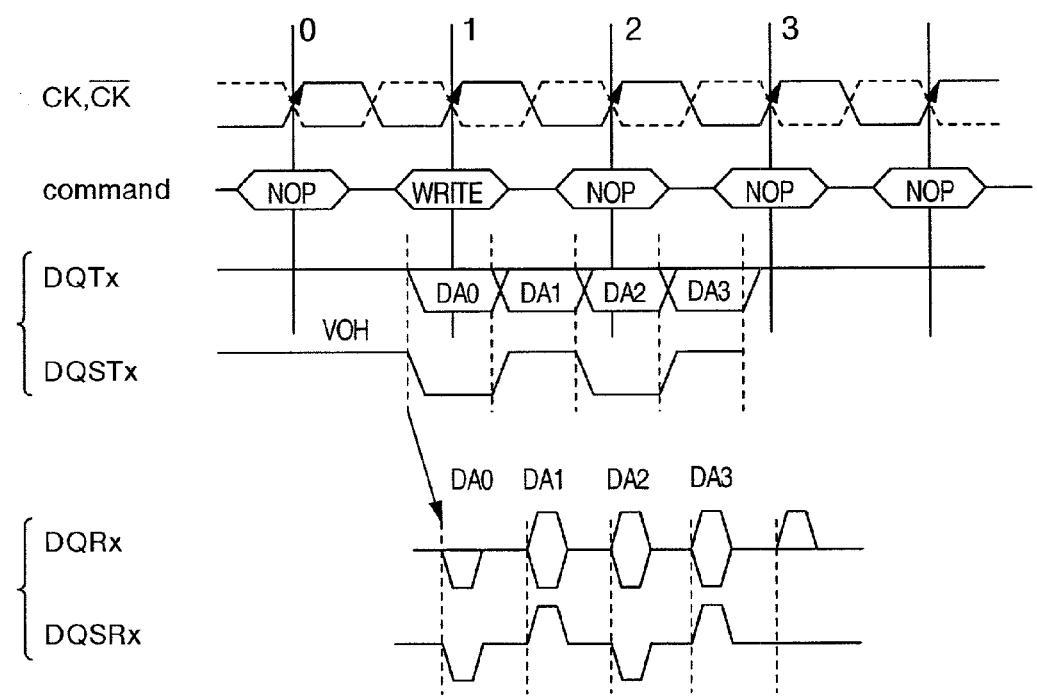
FIG. 23 is a timing chart of memory write using the first embodiment of the bus system according to the invention.

In contrast thereto, when the directional coupler of the first embodiment of the bus system is used, data can be issued in synchronism with the command as shown in FIG. 23, where DQTx represents a data signal waveform transmitted from the MC 10-1 and DQRx represents backward crosstalk induced by the directional coupler, which backward crosstalk is a data signal waveform inputted to the receiver of the DRAM. Similarly, in the case of strobe, DQSTx and DQSRx represent the output signal from MC and the input signal to the DRAM, respectively.

As will be seen from FIG. 23, the write command and DQTx representing data can simultaneously be issued from the MC and DQSTx representing the strobe signal can also be driven in stage 1. In other words, as the DQSTx changes from Hiz to L, a pulse is generated in the DQSRx signal and this pulse can be discriminated by the DRAM. Accordingly, there is no need of providing the preamble for the DQS and the write command and write data can be issued simultaneously. This accounts for the fact that the access latency of the memory write can be shortened by one stage. Thus, latency for memory access in the system can be improved and the system performance can be promoted.

In the case of the bus using the directional coupler based on the SSTL driver, that is, when the main line and the sub coupling line are terminated as in the case of the prior art of FIG. 2, the amplitude of the preamble is half the amplitude of data transfer. In other words, the drive amplitude during transition from Hiz state to L state or Hiz state to H state is approximately half the signal during transition from L state to H state or vice versa. As a result, the amplitude inputted to the receiver is halved and the receiver runs short of sensitivity and therefore, the amplitude must be assured. Thus, in case the SSTL driver is used, it is necessary that the strobe signal be once shifted from Hiz state to L state to assure the signal amplitude so that access time may be prolonged during memory write.

In the memory controller, the signal for data transfer is binary and the memory controller is set to have an impedance equal to the characteristic impedance of the wiring line. Namely, the Hiz state during no data transfer and the H state are at the same potential and the memory controller is driven with the same impedance as the characteristic impedance of the line. During L state of data, too, the L signal is driven with the same impedance as the characteristic impedance. This permits the reflection wave to be absorbed.

The amplitude remains unchanged for the case where the signal is driven from Hiz state to L state and the case where the signal is driven from H state to L state and therefore, signals passing through the coupler during two transfer operations have the same amplitude. In this manner, the same signal amplitude can be kept during any signal transition and the preamble is unneeded. Since the preamble is unneeded, the memory access time can be shortened to raise the bus utilization efficiency and the system performance can be promoted.

Figure 24:
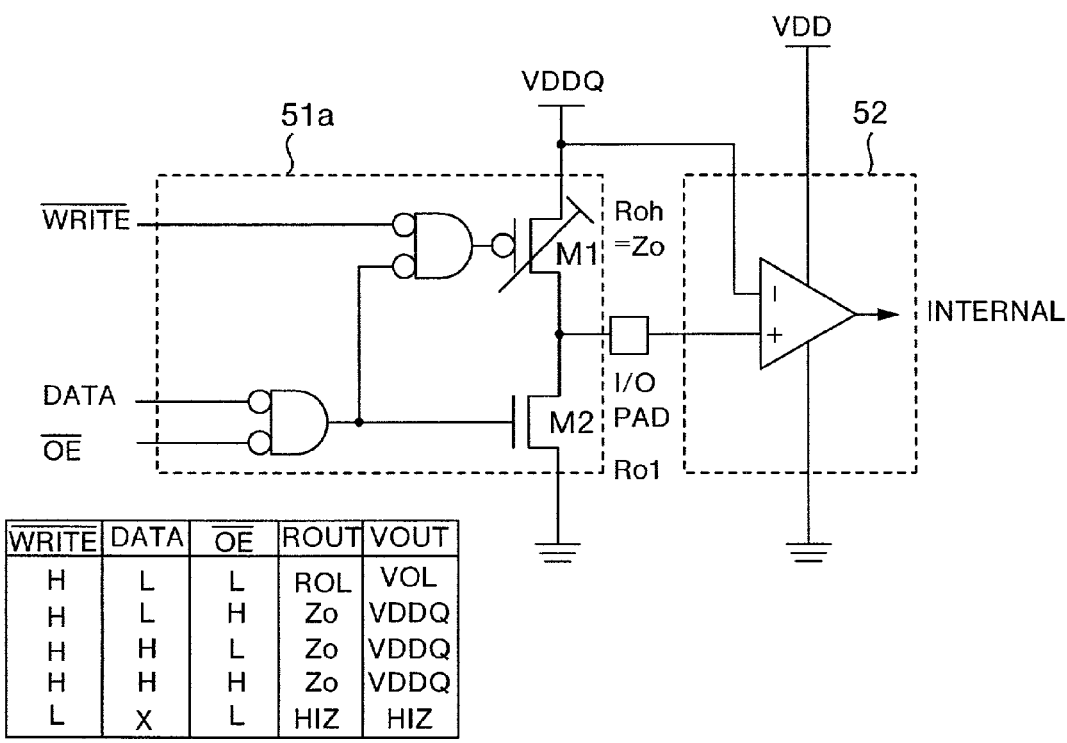
FIG. 24 is a circuit diagram of a DRAM interface capable of doubling the input amplitude.

Next, a method of increasing the signal amplitude of memory write data will be described with reference to FIGS. 24 and 25.

As in the case of FIG. 14, the input impedance of the DRAM also matches the impedance of the wiring. Accordingly, as the data signal for memory write, a signal of the same amplitude as that of the signal generated by the directional coupler is inputted. This signal amplitude can be increased with the construction of FIG. 24.

A driver in the present embodiment is designated by reference numeral 51a. A receiver 52 has the same construction as that in FIG. 14. As compared to FIG. 14, the driver 51a is added with a control signal (WRITE). Operation is indicated at table in FIG. 24. More particularly, when the WRITE signal is at H, operation is the same as that in FIG. 14 but when the WRITE signal assumes L, transistors M1 and M2 also assume HiZ and as a result, the input impedance of the DRAM assumes HiZ. In other words, the impedance of driver 51a of the DRAM to which the WRITE signal at L is inputted becomes HiZ and the signal from the line undergoes total reflection. Thus, the signal amplitude from the line is doubled and then inputted to the receiver 52. Accordingly, the sensitivity of the receiver 52 is increased as compared to that in FIG. 14 and in addition, the noise margin is increased to raise the noise immunity.

The DRAM having this circuit is connected, in one to one relation, to a DRAM or a termination module having the same impedance as the characteristic impedance of the line through the directional coupler as shown in FIG. 1. Accordingly, even when the DRAM having the FIG. 24 I/O circuit assumes HiZ and the signal from the directional coupler undergoes total reflection, a reflection wave can be absorbed if the WRITE signal for the other DRAM assumes H or the termination module is connected. Thus, even with the driver 51a rendered to assume HiZ, the signal on the line 1-2 for connecting the DRAM's is not disturbed to permit stable operation.

Next, the output timing of WRITE signal will be described with reference to FIG. 25.

Figure 25:
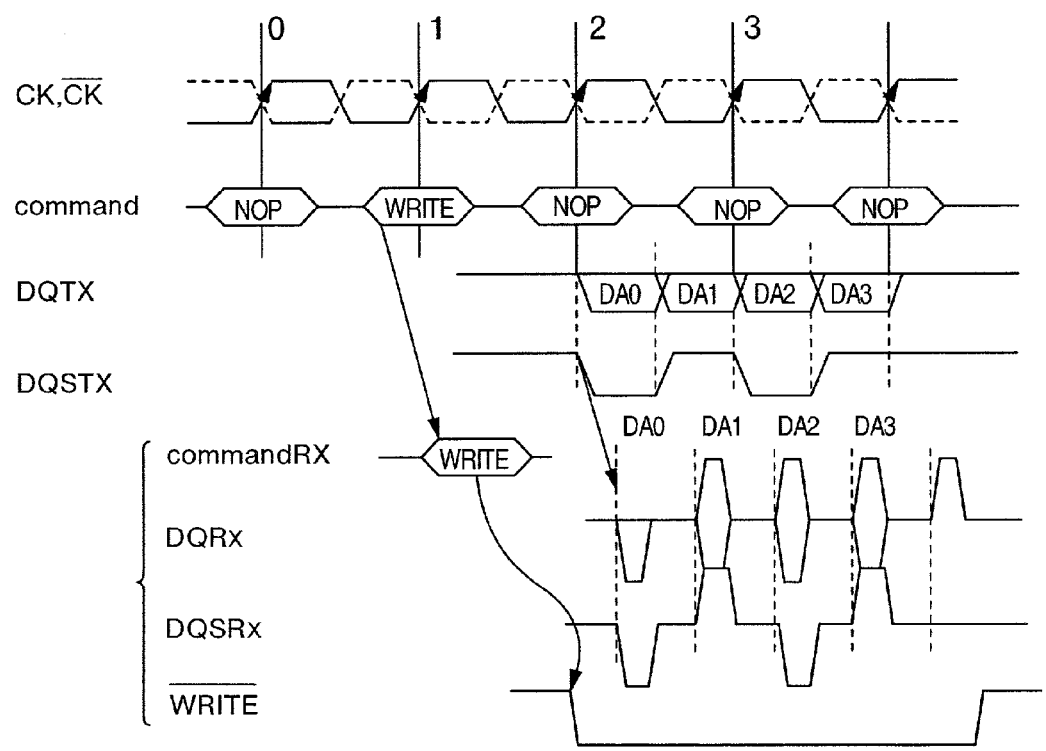
FIG. 25 is a timing chart of memory write to the DRAM of FIG. 24.

FIG. 25 shows, like FIG. 22, an example where there is a vacancy of one stage between issuance of WRITE command and delivery of write data. The WRITE command is delivered out of the MC and reaches a DRAM after propagation delay time of the wiring line. This signal reaching the DRAM is designated at COMMANDRx. The DRAM receives, in addition to this WRITE command, a chip select signal and another control signal to recognize that the DRAM of its own is an object to be written.

After one stage following the issuance of the WRITE command, DQTx and DQSTx are delivered to reach the DRAM after the same wiring delay time. The reaching DQTx and DQSTx are designated at DQRx and DQSRx. The WRITE signal at negative logic is delivered after a WRITE command signal representing an internal signal of the DRAM is received. Then, the duration of L state of the WRITE signal is substantially equal to or longer than the burst length of data. Accordingly, during this period, the input impedance of the DRAM representing the write object assumes HiZ, so that the signal amplitude is doubled only during reception of the write data. Thus, the noise margin of the receiver can be assured and waveform distortion is lessened to permit stable operation.

Figure 26:
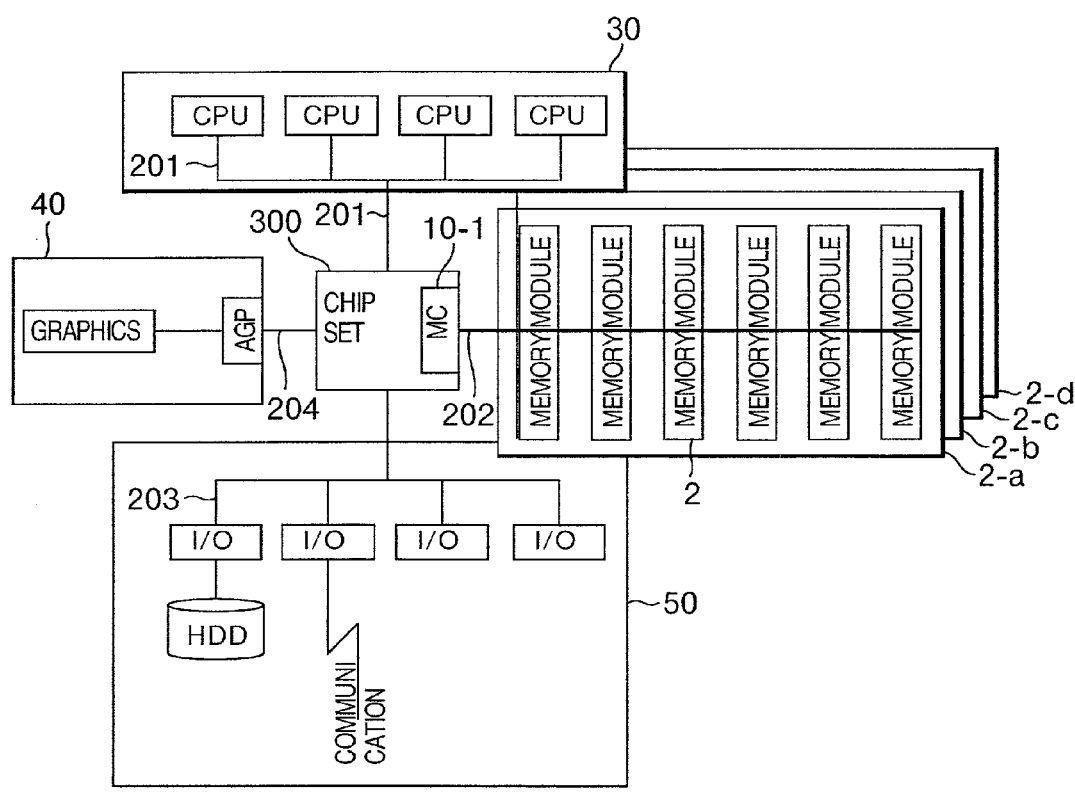
FIG. 26 is a block diagram showing an embodiment in which the bus system of the invention is applied to an information processing system provided with a memory bus using a main line having an open-end/short-circuit end.

Referring now to FIG. 26, there is illustrated an embodiment to which the memory bus system using directional couplers of the invention is applied.

In FIG. 26, four CPU's, generally designated at 30, are mutually connected to a chip set 300 by a processor bus 201. The chip set 300 incorporates a memory controller 10-1 for controlling DRAM's and the memory controller 10-1 is mutually connected to the DRAM's by a memory bus 202. Further, an I/O LSI, generally designated at 50, for connection of such a peripheral unit as a PCI (peripheral connect interface) is mutually connected to the chip set 300 by an I/O bus 203. The chip set 300 is connected to a graphic control LSI 40 through a graphic bus 204 to form a graphic port.

These buses 201 to 204 are connected to the chip set 300 which is in charge of data transmission/reception between the buses 201 to 204.

Here, data transfer using the couplers is applied to the memory bus 202. Advantageously, this permit high-speed operation of memory access so as to improve the throughput and to shorten the latency, thereby improving the system performance.

Figure 27:
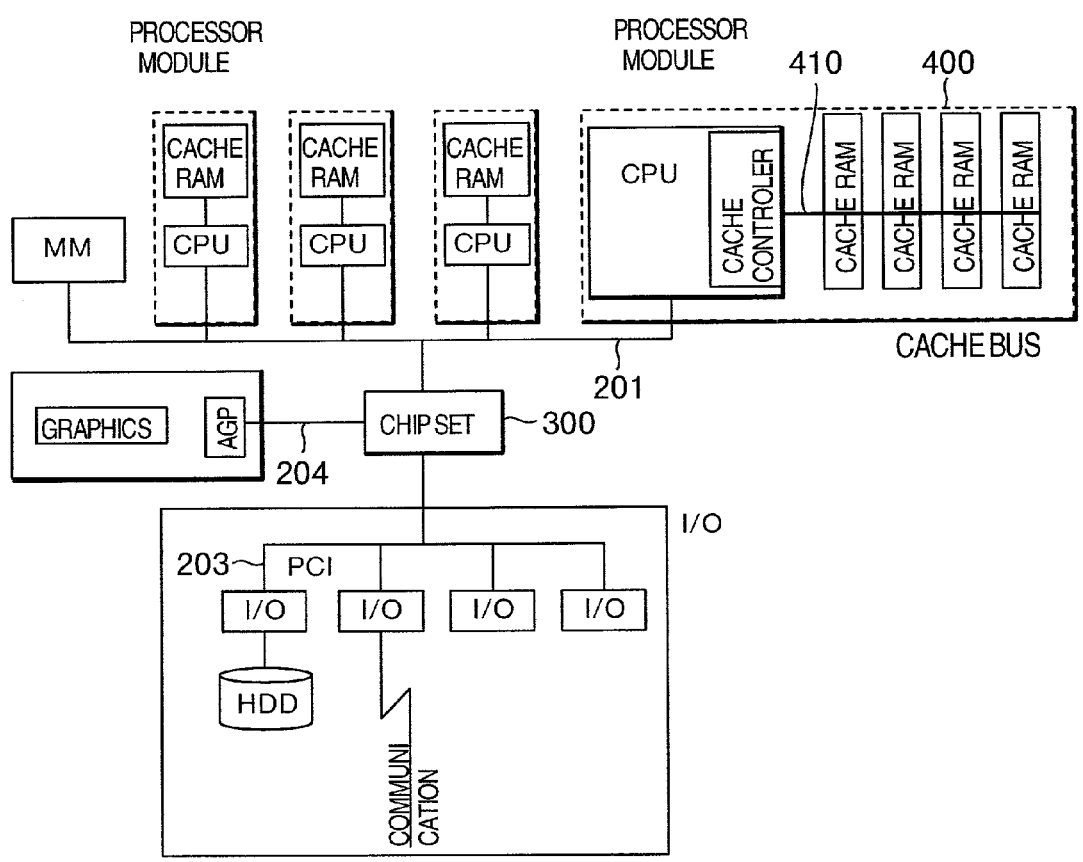
FIG. 27 is a block diagram showing another embodiment in which the bus system is applied to an information processing system having a cache memory bus using a main line having open-end/short-circuit end.

FIG. 27 shows another embodiment to which the bus system is applied. In this embodiment, the memory bus system is applied to a cache memory bus 410 in a processor module 400 as shown in FIG. 27 to attain comparable effects. In this case, couplers are formed in the processor module. For example, when a technique for packaging many semiconductors in one package, such as MCM (Multi Chip Module), is used, a processor incorporating a cache controller can be connected with a cache memory by means of packaged couplers to permit high-speed data transfer.

A fifth embodiment of the bus system will be described with reference to FIG. 28.

Figure 28:
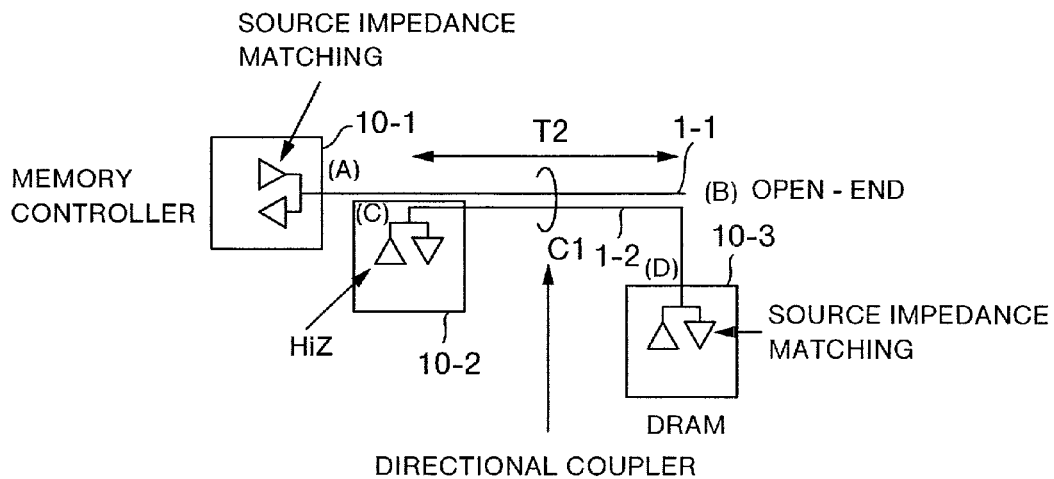
FIG. 28 is a schematic block circuit diagram for explaining a fifth embodiment of the bus system according to the invention.

A signal of one bit of a bus essentially constructed of multiple bits is taken out in FIG. 28 for convenience of explanation of the present embodiment. In the present embodiment, data transfer between one MC and two DRAM's is carried out by using one directional coupler to increase the signal level to be generated.

In the bus of the present embodiment, MC 10-1 and DRAM's 10-2 and 10-3 are connected and the MC 10-1 and DRA 10-3 have inner impedances, as viewed from their pins, which are equal to a characteristic impedance of the line, thus setting up so-called source impedance matching. The DRAM 10-2, however, has an input impedance of HiZ. Of ends of a directional coupler C1, one end of line 1-2 on the MC 10-1 side is connected to the DRAM 10-2 and this line is very short. For example, in a mother board carrying the MC 10-1, the DRAM 10-2 is directly attached immediately below the coupler C1 in order to minimize the length of that wiring line.

A wiring line from the DRAM 10-3 other end of the coupler C1 to a terminal (D) of DRAM 10-3 may have an appreciable length, for example, in the case of module configuration. It is to be noted that of the line 1-2, a sub coupling line constituting the coupler merges, at its end on the DRAM 10-3 side, into a line vertically confronting an end (B) of sub coupling line 1—1 and extending therefrom. Thus, there is no extra wiring on the side of the sub coupling line.

Figure 29:
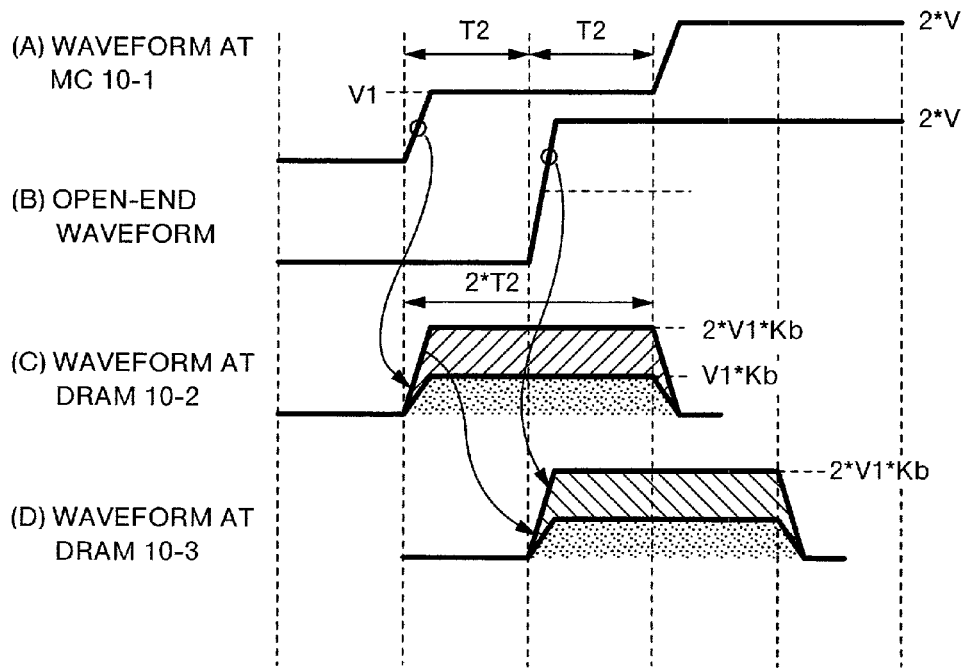
FIG. 29 is a timing chart of write from MC 10-1 to DRAM's 10-2 and 10-3 in the fifth embodiment.

Referring to FIG. 29, waveforms during memory write operation based on the wiring configuration of FIG. 28 will be described. For convenience of explanation, it is assumed that the wiring length from the MC 10-1 to the coupler and the wiring length from the sub coupling line to the DRAM 10-3 are negligibly short.

Waveforms of memory write data from the MC 10-1 are illustrated in FIG. 29. A waveform at (A) is in source impedance matching and like the waveform (A) in FIG. 4, keeps a voltage (V1), approximately half the drive voltage, during the period for reciprocative propagation delay time T2 of the directional coupler. Thereafter, a reflection wave returns and the voltage rises to (2×V1). At the end (B) of line 1—1 opposite to the MC 10-1, a forward wave arrives after the delay time T2 and at the same time, a reflection wave is generated. The reflection wave is superimposed on the forward wave to assume a voltage of (2×V1).

A backward crosstalk signal (Kb×V1) generated when the forward wave propagates from end (A) to end (B) through the coupler C1 is transmitted to the terminal (C) of the line 1-2. Since the (C) end assumes HiZ, the backward crosstalk signal undergoes total reflection so as to be doubled, producing a signal voltage of (2×Kb×V1) at the terminal (C).

A voltage of (2×Kb×V1) propagates to the terminal (D) of the line 1-2. This results from the superimposition of the two backward crosstalk signals.

To explain, a signal generated at the (C) end by the forward wave in the coupler C1 is reflected at the end (C) of the line 1-2, thus forming the first backward crosstalk that propagates to the end (D) of line 1-2. This propagating signal assumes Kb×V1. The forward wave propagating through the coupler C1 is reflected at the (B) end of wiring line 1—1 and a reflection wave generates the second backward crosstalk signal (Kb×V1) at the (D) end of line 1-2 through the coupler C1. These two backward crosstalk signals are in phase and superimposed on each other in phase to generate the doubled signal (2×Kb×V1). The input impedance of the DRAM 10-3 matches the characteristic impedance of the wiring line and therefore the wave is absorbed at the terminal of the DRAM 10-3 without undergoing reflection again. In this embodiment, the signal amplitude is doubly increased as compared to that in FIG. 4.

Namely, during the memory write operation, reflection at the ends (C) and (D) is utilized to double the signal amplitude. Accordingly, the noise immunity of the DRAM's 10-2 and 10-3 is promoted to realize stable and high-speed data transfer.

Waveforms during memory read operation based on the wiring configuration of FIG. 28 will be described with reference to FIG. 30.

Figure 30:
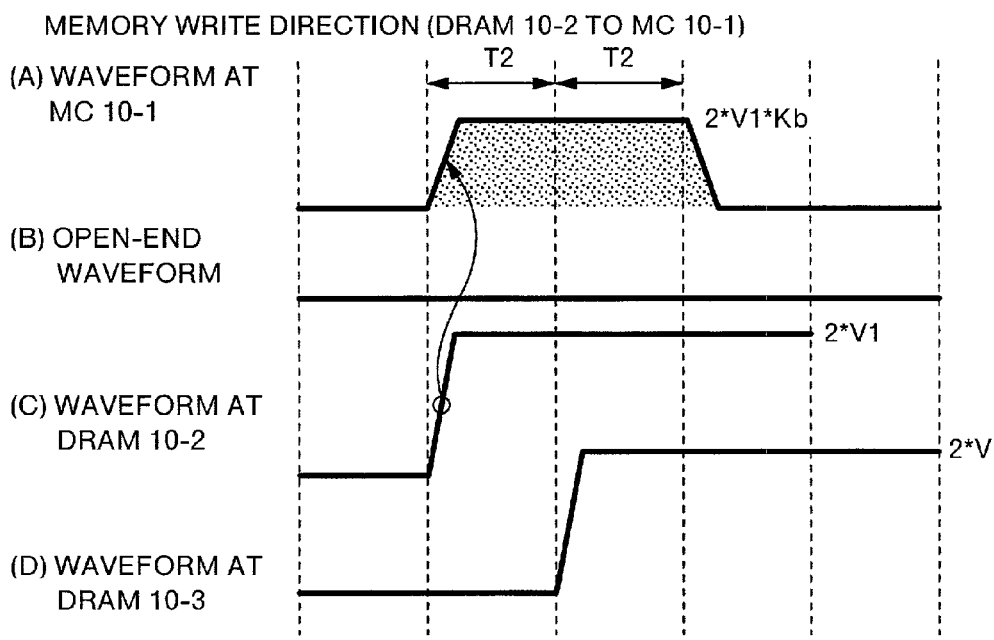
FIG. 30 is a timing diagram of read from the DRAM 10-2 to the MC in the fifth embodiment.

FIG. 30 shows waveforms of memory read data from the DRAM 10-2. The driver of the DRAM 10-2 is driven through an impedance lower than the characteristic impedance of the line and therefore a waveform of substantially full amplitude (2×V1) is delivered to the end (C). The driven signal is absorbed at the end (D) after delay time T2. This is because by virtue of the source impedance matching function owned by the DRAM 10-3, matching termination is set up. The signal from DRAM 10-2 transmitting through the line 1-2 generates backward crosstalk and a voltage developing at the end (A) assumes 2×V1×Kb. It is to be noted that source impedance matching is also set up at the end (A) and no reflection takes place there.

Figure 31:
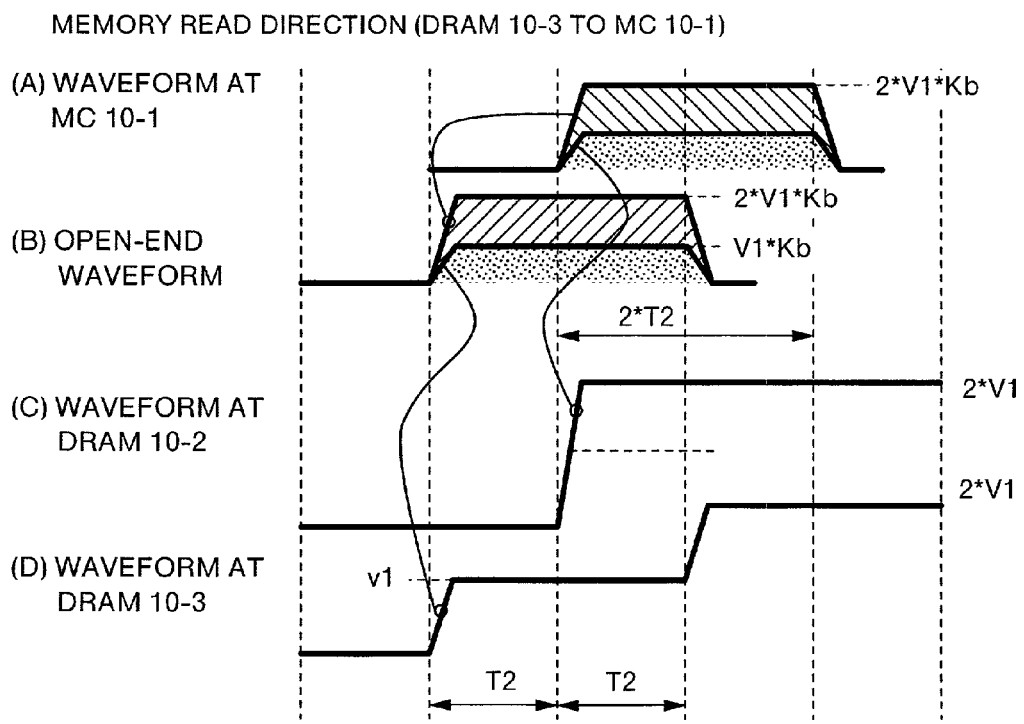
FIG. 31 is a timing chart of read from the DRAM 10-3 to the MC in the fifth embodiment.

FIG. 31 shows memory read data waveforms from the DRAM 10-3.

An output from the DRAM 10-3 having the source impedance matching driver has amplitude (V1) which is half the power supply voltage and it assumes full amplitude owing to a reflection wave after (2×T2) as in the case of FIG. 29. A drive signal voltage heading for the end (C) from the end (D) through the sub coupling line generates a backward cross voltage (V1×Kb) at the end (B) and immediately thereafter, it is reflected at the end (B) so as to head for the end (A). Further, a signal undergoing total reflection at the end (C) of the sub coupling line is then returned toward the end (D). At that time, a backward crosstalk signal (V1×Kb) is also generated at the end (A) of the sub coupling line. The two signals on the sub coupling line superimpose each other in phase to generate a doubled signal at the end (A). Accordingly, the memory read data from the DRAM 10-3 also assumes (2×V1×Kb) and the signal level is doubled.

As will be seen from the above, for the memory read data from the DRAM's 10-2 and 10-3, the signal level can also become (2×V1×Kb).

In this manner, during both the memory write operation and the memory read operation, the signal amplitude can be doubled amounting up to (2×V1×Kb) and consequently, in the data transfer between the MC 10-1 and the DRAM's 10-2 and 10-3, the noise immunity can be promoted and stable and high-speed data transfer can be realized.

Figure 32:
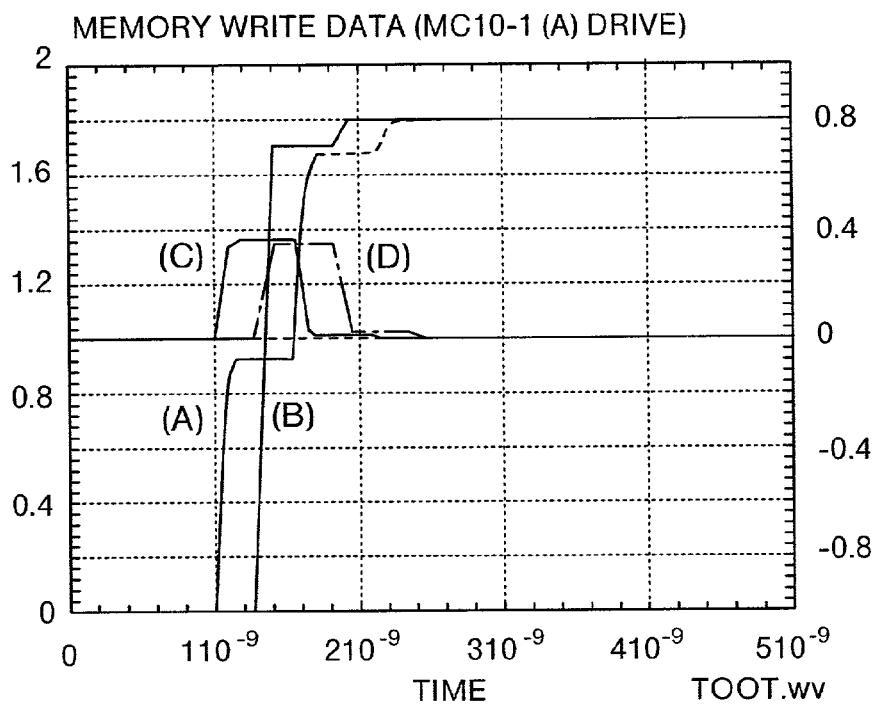
FIG. 32 is a time chart showing waveforms of write data from the MC 10-1 to the DRAM's 10-2 and 10-3 in the fifth embodiment.
Figure 33:
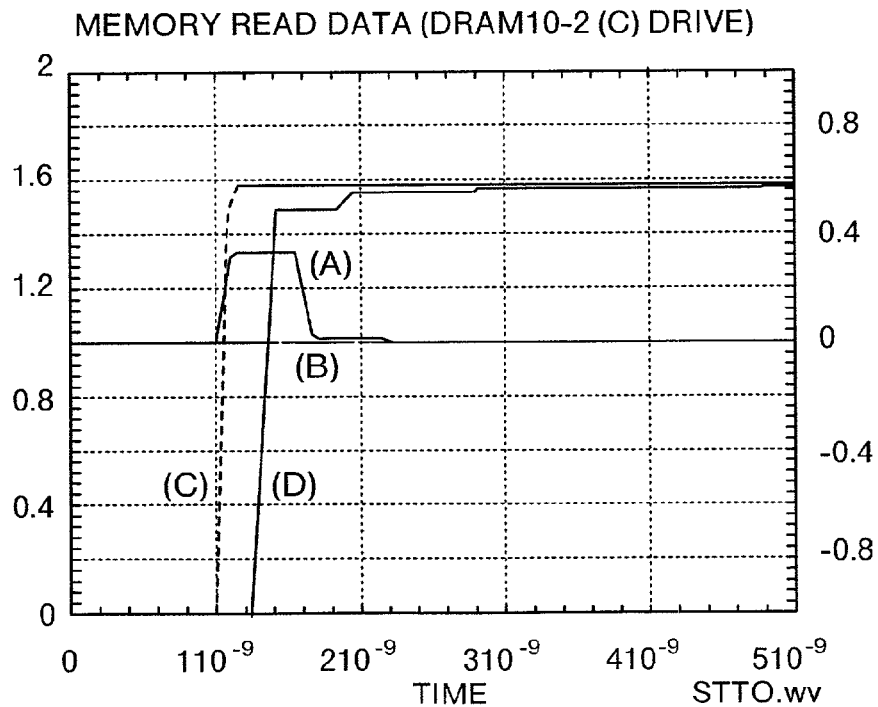
FIG. 33 is a time chart showing waveforms of read data from the DRAM 10-2 to the MC in the fifth embodiment.

As shown in FIGS. 32 and 33, the above behavior of memory access is confirmed through simulation.

FIG. 32 shows memory write data waveforms delivered out of the MC 10-1. The coupling line has geometrical dimensions indicated in the wiring sectional view of FIG. 7 and the wiring length of the coupler is the same as that in FIG. 8, amounting up to 40 mm. In FIGS. 32 and 33, it is assumed as in the precedence that the wiring lengths of a lead wiring of line 1—1 from the MC 10-1 to the coupler and a wiring line of line 1-2 from the sub coupling line to the DRAM 10-3 are negligibly short.

Results of the simulation show that in the memory writ data waveforms of FIG. 32, the signal assumes, at the ends (C) and (D), about 390 mV that is about 1.8 times the 220 mV level at the ends K1 and J1 in FIG. 9. This results from the fact that the crosstalk superimposes on the reflection wave in phase as described previously.

FIG. 33 shows data waveforms during memory read from the DRAM 10-2. The output impedance of the DRAM 10-2 amounts to 10Ω that is lower than the characteristic impedance of the wiring, and so the DRAM 10-2 is driven at substantially full amplitude to propagate data to the end (A), that is, the MC 10-1 by means of the directional coupler C1 in FIG. 28. The signal amplitude at that time is also about 320 mV, indicating that the signal amplitude is substantially the same as that in FIG. 11. As will be seen from FIGS. 32 and 33, the time width of the generated signal equals the reciprocative propagation delay time (2×T2) amounting up to 0.48 ns and it also equals the backward crosstalk width in FIGS. 9, 11 and 12.

Data transmission waveforms from the DRAM 10-3 to the MC 10-1 are substantially the same as those in FIG. 32. This is because the load condition as viewed from the DRAM 10-3 substantially coincides with the load condition as viewed from the MC 10-1. The load condition as viewed from the DRAM 10-3 covers the wiring to the coupler and the directional coupler not terminated, and the wiring condition for the other wiring 1—1 constituting the coupler is MC 10-1 in which the near end is open and the remote end is terminated with respect to DRAM 10-3 and is equal to the load condition as viewed from MC 10-1. The load condition of the DRAM 10-3 differs from the load condition of the MC 10-1 only in that the DRAM 10-2 is connected to the wiring line on the DRAM 10-3 side. But the input impedance of the DRAM 10-2 is HiZ and is regarded as substantially open-ended and so the read data waveforms from the DRAM 10-3 are substantially identical to those in FIG. 32. In other words, in FIG. 32, waveform (A) in dotted line corresponds to the output waveform form the DRAM 10-3, waveform (B) corresponds to a waveform at the end (C) of DRAM 10-2, waveform (C) corresponds to a waveform at the end (B) and waveform (D) corresponds to the input waveform to the MC 10-1.

The results of the simulation as above show that with the construction of FIG. 28, both the memory write data signal from the MC 10-1 and the read data waveforms from the DRAM's 10-2 and 10-3 have the amplitude in excess of 350 mV and the signal voltage for memory write is increased as compared to that in FIG. 1.

Figure 34:
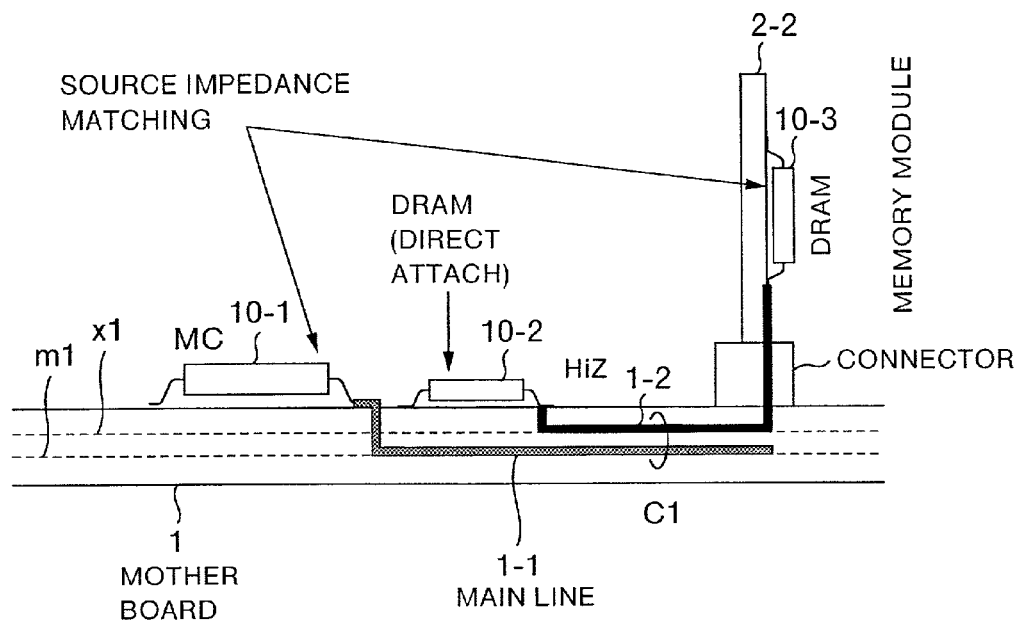
FIG. 34 is a sectional diagram showing board packaging in the fifth embodiment.
Figure 35:
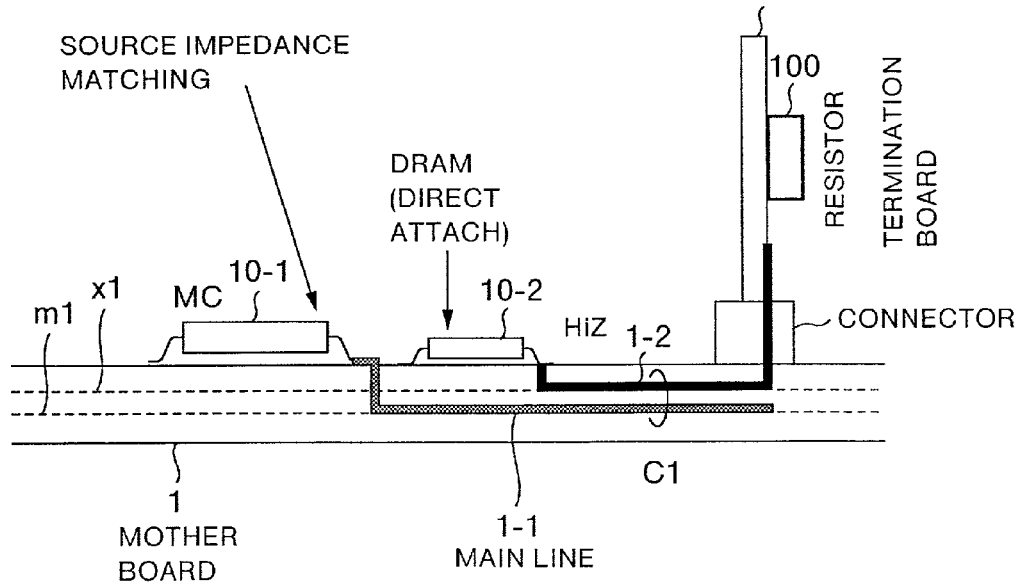
FIG. 35 is a sectional diagram showing board packaging (in the case of packaging a terminated board) in the fifth embodiment.

In the fifth embodiment of FIG. 28, the bus system can be packaged as shown in FIGS. 34 and 35 in sectional form.

Like FIGS. 15 and 16, FIG. 34 shows a mother board 1 in longitudinal sectional form. In FIG. 34, the DRAM 10-2 having the input impedance Hiz in FIG. 28 is directly packaged to the mother board 1 and the DRAM 10-3 having the input impedance in source impedance matching is packaged to a memory module 2—2 and connected to the mother board through a connector. A directional coupler for connecting the individual chips is formed in the mother board 1 and the line 1—1 including the sub coupling line from the MC 10-1 is formed in a layer m1, with the line 1-2 including the sub coupling line formed in a layer x1. It is to be noted that the main line 1—1 ends at a point where the sub coupling line 1-2 is led to the memory module 2—2. Advantageously, this permits the backward crosstalk to superimpose on the reflection in phase so as to amplify the signal.

The DRAM 10-3 has been described as being terminated (being in source impedance matchin) but a method may of course be employed in which an external resistor is added to the DRAM having the input impedance HiZ to cause it to be terminated. In that case, the DRAM's 10-2 and 10-3 having the same construction can be used.

In FIG. 35, a termination board 2-2' is inserted in the connector in place of the memory module 2—2 in FIG. 34. This example is therefore applicable to a system in which the memory capacity required by the system is satisfied at the minimum from the standpoint of the system construction by packaging the DRAM 10-2 and the system constructed as shown in FIG. 35 is shipped without alteration. When the memory is required to be expanded later with the aim of, for example, improving the system performance, the termination board 2-2' in FIG. 35 is removed and the memory module 2—2 carrying the DRAM 10-3 as shown in FIG. 34 can be inserted to expand the memory. Thus, the packaging method having potential expandability of the system as shown in FIGS. 34 and 35 can be employed in the present embodiment.

Even when the DRAM 10-2 is not carried but only the memory module 2—2 is carried in FIG. 34, the same signal can be generated to permit data transfer between the MC 10-1 and the DRAM 10-3. Even when restriction imposed on packaging prevents the DRAM 10-2 to be carried, the signal level can be doubled to advantage.

A sixth embodiment of the bus system will be described with reference to FIG. 36.

In comparison with the fifth embodiment of FIG. 28, the capacity of DRAM's that can be carried is increased in the present embodiment.

In a bus of the present embodiment, MC 10-1 and DRAM's 10-2 to 10-5 are connected and the inner impedance of each of the MC 10-1 and DRAM's 10-3 and 10-5, as viewed from its pin, is equal to the characteristic impedance of the line, thus being in source impedance matching. The input impedance of each of the DRAM's 10-2 and 10-4 is HiZ. Sub coupling lines 1-2*a* and 1-2*b* constitute a directional coupler C1 and the DRAM 10-2 is connected to one end of the sub coupling line 1-2*a*, with the DRAM 10-4 connected to one end of the sub coupling line 1-2*b*. For example, the DRAM's 10-2 and 10-4 can be directly attached immediately below and above the coupler C1 in the mother board carrying the MC 10-1, respectively.

The wiring lines from the other ends of the sub coupling lines 1-2*a* and 1-2*b* constituting the coupler C1 to the DRAM's 10-3 and 10-5 can have an appreciable length as in the case of the module configuration of FIG. 34. But, the other ends of the sub coupling lines on the side of the DRAM's 10-3 and 10-5 are led vertically of the sub coupling line at positions confronting the end of the sub coupling line and the sub coupling line does not jut out of or is not short of the sub coupling lines.

In the directional coupler C1, the wiring lines 1-2*a* and 1-2*b* are laid on both sides of the line 1—1 connected to the MC 10-1 and they are so adjusted as to have the same backward crosstalk coefficient. In other words, the lines 1-2*a* and 1-2*b* are arranged to have the same line width, the same wiring length, and the same pitch with respect to the main line. Since the lines 1-2*a* and 1-2*b* are constructed in this manner, the memory write data signal has the same waveform for the DRAM's 10-2 and 10-4 or the DRAM's 10-3 and 10-5 as described in connection with FIG. 29. In other words, for the DRAM's 10-2 to 10-5, the signal amplitude is uniformly increased so as to be doubled, amounting up to (2×Kb×V1), by virtue of the superimposition of the reflection wave.

In the directional coupler C1, the sub coupling lines 1-2*a* and 1-2*b* are so constructed as to have the same coupling coefficient with respect to the line 1—1 connected to the MC 10-1 as described previously and therefore, waveforms of memory read data from the DRAM's 10-2 and 10-4 similarly have the same amplitude, amounting to (2×Kb×V1) as described in connection with FIG. 30. The memory read waveforms from the DRAM 10-3 or 10-5 also have the same magnitude as that in FIG. 31, amounting up to (2×Kb×V1).

Figure 36:
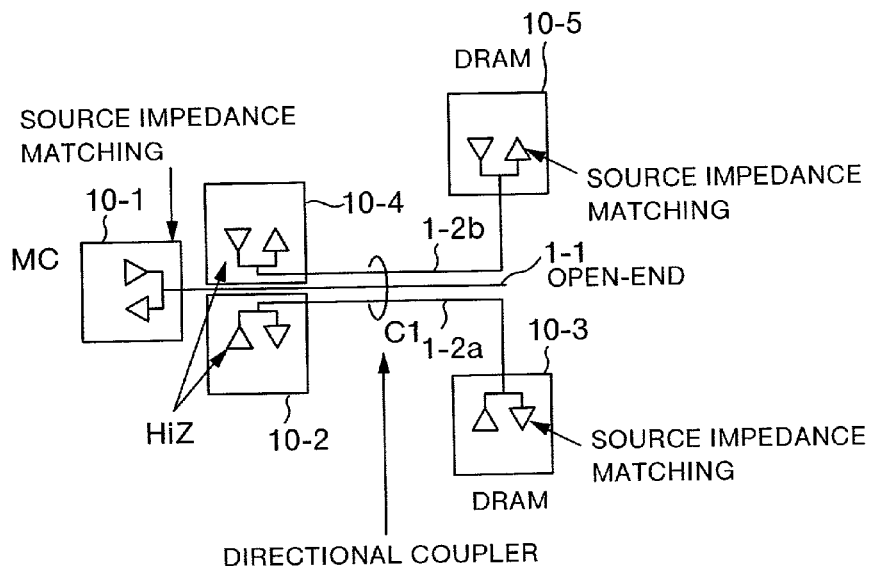
FIG. 36 is a schematic block diagram for explaining a sixth embodiment of the bus system according to the invention.

With the construction shown in FIG. 36, the four DRAM's 10-2 to 10-5 can be connected to one MC 10-1 and the memory capacity can advantageously be increased as compared to the fifth embodiment. Obviously, the DRAM's 10-3 and 10-5 may be carried in modules and when the system suffices less memory capacity, the module may terminate in a terminating board but when extension is needed the memory modules may be exchanged with those packaging the DRAM's 10-3 and 10-5, thus providing the system with memory extensibility.

Figure 37:
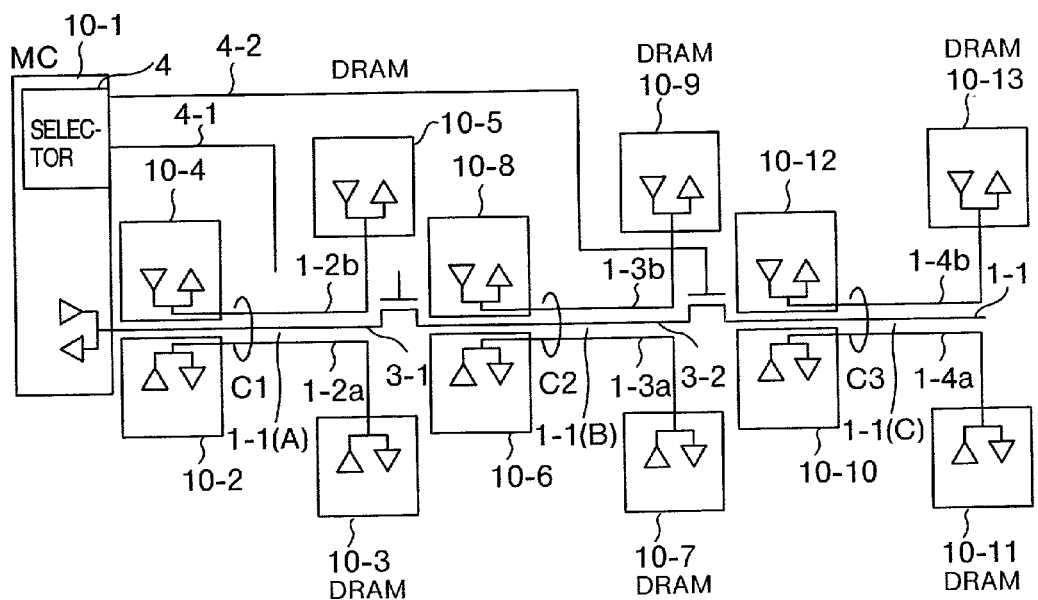
FIG. 37 is a schematic block diagram for explaining a seventh embodiment of the bus system according to the invention.

A seventh embodiment of the bus system will be described using FIG. 37.

In the present embodiment, connecting means such as a MOS switch intervenes in the sub coupling line of FIG. 36 to expand the memory carrying capacity.

There are provided MOS switches 3-1 and 3-2 that are controllable by switching means (selector) 4 provided in MC 10-1. The MOS switches 3-1 and 3-2 are inserted in a line 1—1 connected to the MC 10-1 and a partial line 1—1 (A) between the MOS switch 3-1 and the MC 10-1 cooperates with lines 1-2a and 1-2b to form a directional coupler C1. A partial line 1—1 (B) between the MOS switches 3-1 and 3-2 cooperates with lines 1-3a and 1-3b to form a directional coupler C2. A partial line 1—1 (C) between the MOS switch 3-2 and the end cooperates with lines 1-4a and 1-4b to form a directional coupler C3. The coupler C1 is connected with DRAM's 10-2 to 10-5, the coupler C2 is connected with DRAM's 10-8 to 10-9 and the coupler C3 is connected with DRAM's 10—10 to 10-13. The connection mode between the couplers C1 to C3 and the DRAM's 10-2 to 10-1 is the same as that in FIG. 36.

When data is transferred between the MC 10-1 and one of the DRAM's 10-2 to 10-5, the MOS switch 3-1 is controlled by the switching means 4 such that the partial line 1—1 (A) is disconnected from the partial line 1—1 (B). Consequently, a signal propagating on the partial line 1—1 (A) undergoes substantially total reflection at the end of the MOS switch 3-1. Accordingly, the MC 10-1 and the DRAM's 10-2 to 10-5 operate in quite the same way as that in FIG. 36.

Next, in case data is transferred between the MC 10-1 and one of the DRAM's 10-6 to 10-9, the MOS switch 3-1 is controlled by the switching means 4 such that the partial line 1—1 (A) conducts to the line 1—1 (B) and the MOS switch 3-2 is controlled by the switching means 4 such that the partial line 1—1 (B) is disconnected from the partial line 1—1 (C). Consequently, a signal propagating on the partial line 1—1 (B) undergoes substantially total reflection at the end of the MOS switch 3-2. Accordingly, the MC 10-1 and the DRAM's 10-6 to 10-9 operate in quite the same way as that in FIG. 36. The DRAM's 10-2 to 10-5 and the lines 1-2a and 1-2b do not contact the partial line 1—1 (A) and the partial lines 1—1 (A) and 1—1 (B) have the same characteristic impedance, so that the signals transmitting on the lines 1—1 (A) and 1—1 (B) are not distorted. Of course, it is preferable that the conduction resistance of the MOS 3-1 is very smaller than the line impedance. Advantageously, this suppresses waveform distortion due to impedance mismatch.

Similarly, in case data is transferred between the MC 10-1 and one of the DRAM's 10—10 to 10-13, the MOS switches 3-1 and 3-2 are controlled by the switching means 4 such that they are rendered to be placed in conduction. Consequently, a signal propagating on the partial line 1—1 (C) undergoes substantially total reflection at the remote end. Accordingly, the MC 10-1 and the DRAM's 10-9 to 10-13 operate in quite the same way as that in FIG. 36.

By rendering the MOS switches 3-1 and 3-2 non-conductive or conductive in this manner, data can be transferred selectively between the MC 10-1 and one of the DRAM's 10-2 and 10-13. In other words, as compared to the case of FIG. 36, the number of DRAM's to be carried on the system can be increased to advantage. The switching means may be used in common with a signal of chip selector used in the DRAM.

Further, it depends on the condition of the system whether all of the DRAM's 10-2 to 10-13 are carried. Accordingly, a small number of DRAM's are first carried and as the function extension is requested, DRAM's may be added. The terminating board 2-2' as shown in FIG. 35 may be used, as necessary.

An eighth embodiment of the bus system will be described by using FIG. 38.

Figure 38:
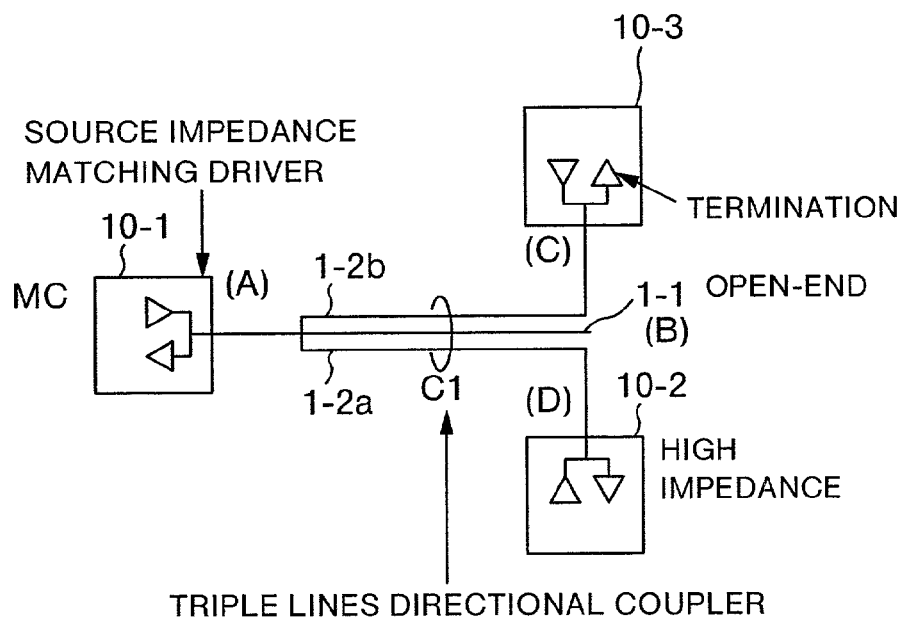
FIG. 38 is a schematic block diagram for explaining an eighth embodiment of the bus system according to the invention.

In FIG. 38, a directional coupler C1 is constituted by a wiring line 1—1 and lines 1-2a and 1-2b laid on both side of the wiring line 1—1 equidistantly from the wiring line 1—1 in close proximity and in parallel relation thereto, as in the case of FIG. 36 and in particular, ends of the lines 1-2a and 1-2b, close to MC 10-1, are connected in common to the MC 10-1. The other ends of the lines 1-2a and 1-2b merge into lead lines extending vertically of the line 1—1 toward DRAM's 10-2 and 10-3.

The input impedance owned by each of the DRAM's 10-2 and 10-3 changes depending on whether access to its memory is present. In the presence of the memory access, the input impedance assumes HiZ and in other cases, it is placed in source impedance matching condition. The MC 10-1 is always placed in source impedance matching condition. With this construction, the signal level can be increased by four times, amounting up to $4 \times Kb \times V1$.

Figure 39:
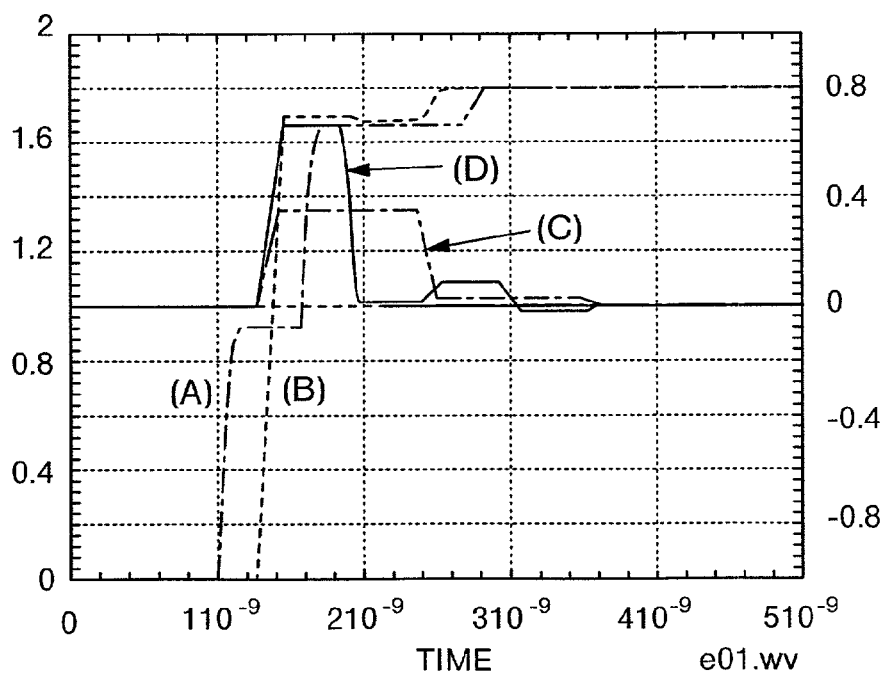
FIG. 39 is a time chart showing simulation waveforms (memory write) in the eighth embodiment.

FIG. 39 shows simulation waveforms of data during memory write. The simulation condition is the same excepting for a portion concerning wiring. A mechanism is as below. In the figure, waveforms for data transfer from the MC 10-1 to the DRAM 10-2 are illustrated.

An output from terminal (A) of the MC 10-1 is a step-like wave because the impedance of the MC 10-1 equals the characteristic impedance of the wiring. A signal propagating on the line 1—1 is designated by V1. This signal generates backward crosstalk in the lines 1-2a and 1-2b and the backward crosstalk amounts up to $Kb \times V1$. The backward crosstalk generated in the line 12b propagates to terminal (D) through the line 1-2a. The signal propagating through the line 1—1 undergoes total reflection at the terminal (B) and this reflection wave again generates backward crosstalk in the lines 1-2a and 1-2b. The thus generated backward crosstalk amounts up to $(Kb \times V1)$ and superimposes, in phase, on the backward crosstalk generated in the line 1-2b by a forward wave on the line 1—1. Consequently, the amplitude of the signal heading for the DRAM 10-2 on the line 1-2a is $(2 \times Kb \times V1)$. Further, when the signal reaches the terminal (D) of the DRAM 10-2, it undergoes total reflection there because the input impedance of the DRAM 10-2 is HiZ and as a result, it takes a signal waveform of $(4 \times Kb \times V1)$ In FIG. 36, it amounts up to about 640 mV. The time width of this signal is 0.48 ns equaling the reciprocative propagation delay time of the coupler C1. It will therefore understood that only the signal amount is increased.

Similarly, by matching the impedance of the DRAM 10-2 to the characteristic impedance of the wiring and making the input impedance of the DRAM 10-3 HiZ, data transfer from the MC 10-1 to the DRAM 10-3 has the same waveforms as those in FIG. 39 and write data can be transferred in the form of a signal of $(4 \times Kb \times V1)$. Next, FIG. 40 shows simulation waveforms of memory read data from the DRAM 10-2 to the MC 10-1.

The output impedance of the DRAM 10-2 is lower than the characteristic impedance of the line, amounting up to $10\Omega$. Accordingly, the amplitude of drive waveform (D) is substantially full, amounting up to about $(2 \times V1)$ and backward crosstalk amounting to $(2 \times Kb \times V1)$ is generated in the line 1—1 by this drive signal toward the terminal (B). At the termination (B), the backward crosstalk undergoes total reflection and this backward crosstalk, as it is, propagates toward the terminal (A). A drive waveform from the DRAM 10-2 propagates to the line 1-2b through the line 1-2a and the drive waveform propagating on the line 1-2b generates backward crosstalk having an amplitude of $(2 \times Kb \times V1)$ in the line 1—1. This backward crosstalk superimposes, in phase, on the backward crosstalk previously reflected at the terminal (B) to generate a signal of $(4 \times Kb \times V1)$ which in turn is inputted to and terminated in the MC 10-1. It will be seen that in FIG. 40, a voltage of about 580 mV is inputted to the terminal (A). The signal waveform has the same time width as that in FIG. 39.

Figures 40, 41:
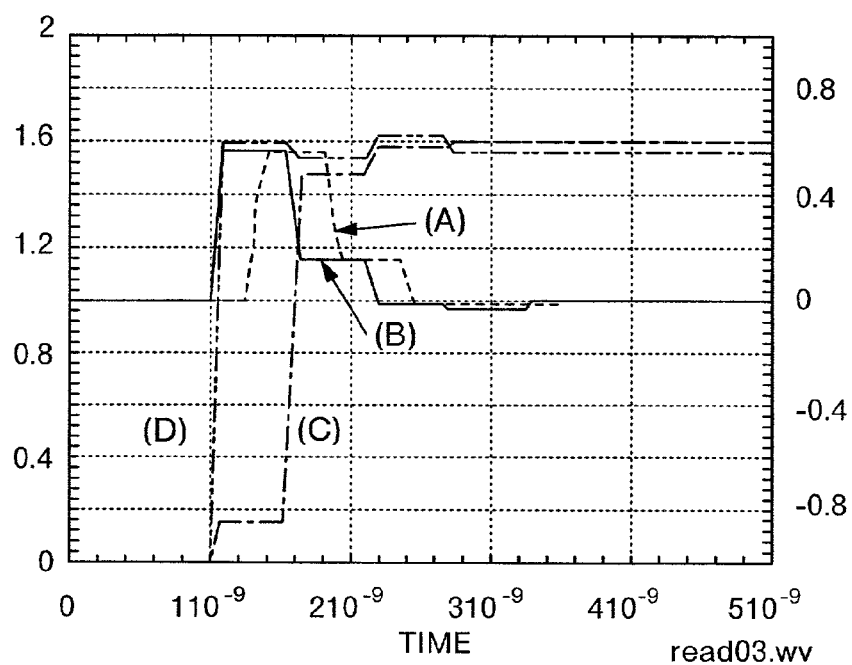
FIG. 40 is a time chart showing simulation waveforms (memory read) in the eighth embodiment.
FIG. 41 is table showing input impedances of the MC 10-1, DRAM 10-2 and DRAM 10-3 in the eighth embodiment.

Referring to FIG. 41, the input impedances of the MC 10-1 and DRAM's 10-2 and 10-3 during each memory access are indicated. The MC 10-1 is in source impedance matching during memory write and memory read and this is indicated by RTT. During memory write, a targeted DRAM assumes HiZ but a non-targeted DRAM is placed in RTT condition. During memory read, a DRAM delivering memory read data has a low output impedance (LOW) but a DRAM not delivering data has its impedance being RTT. It can be recognized by a chip select (CS) signal whether the DRAM's 10-2 and 10-3 are objects in charge of data transfer.

Through construction and operation as above, the signal can be approximately four times increased, amounting to (4×Kb×V1). In other words, even when the drive signal is reduced in amplitude, a sufficient signal level can be obtained to advantage. Obviously, by cascading the MOS switches as shown in FIG. 38, the number of DRAM's connected to the bus can be increased.

Still another embodiment of the I/O circuit will be described by using FIG. 42.

Figure 42:
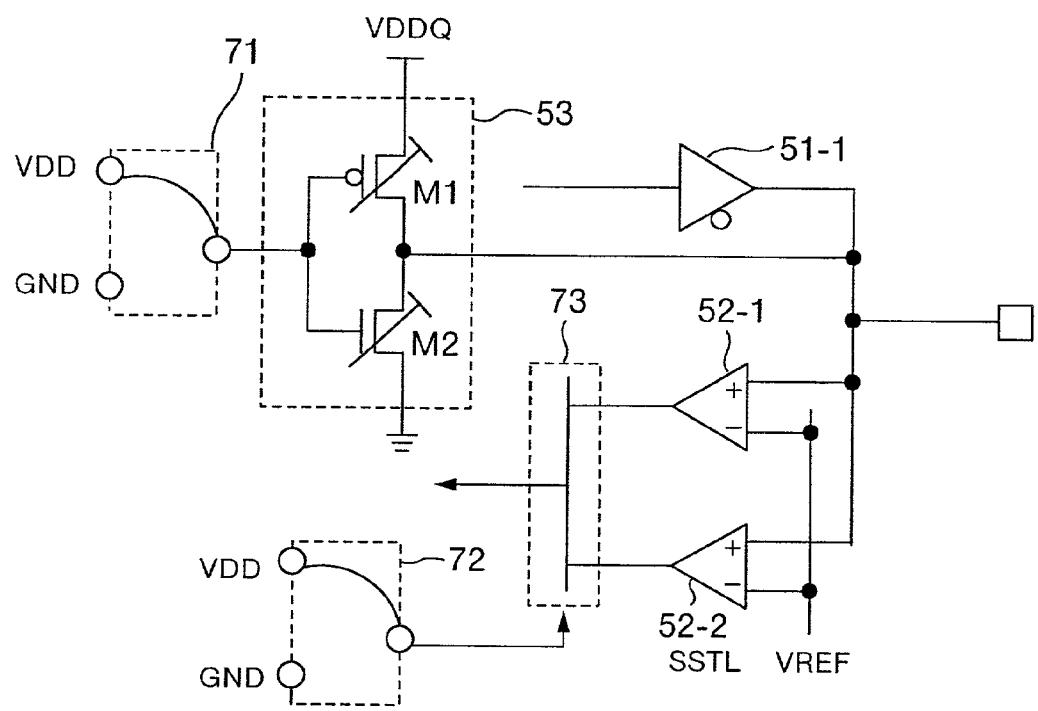
FIG. 42 is a schematic block circuit diagram showing still another embodiment of the I/O circuit.

FIG. 42 shows the construction of an I/O circuit of DRAM or MC 10-1 having a driver and receiver or termination means. Reference numeral 53 designates termination means, 51-1 a driver, 52-1 a receiver having a hysteresis characteristic and 52-2 a receiver not having any hysteresis characteristic. Switching means 73 switches the receivers 52-1 and 52-2. Bonding switching means 72 is connected when a semiconductor device including the present I/O circuit is fabricated and is transferable to either VDD or GND during fabrication. In the figure, VDD or HIGH logical signal is applied to the switching means 73. Similarly, means 71 can be switched during fabrication to either turn on or turn off the termination means 53.

Therefore, even in the case where the input impedance of the DRAM 10-2 differs from that of the DRAM 10-3 as in the case of, for example, FIG. 28, these DRAM's are formed using the same semiconductor mask but two functions can be provided using one mask when the bonding switching means 71 is switched during fabrication. Similarly, the receiver 52-2 such as SSTL representing the conventional DRAM interface and the receiver 52-1 having the hysteresis characteristic suitable for the directional coupler can be formed using the same semiconductor mask and are switched during fabrication, thereby reducing the fabrication cost.

Figure 43:
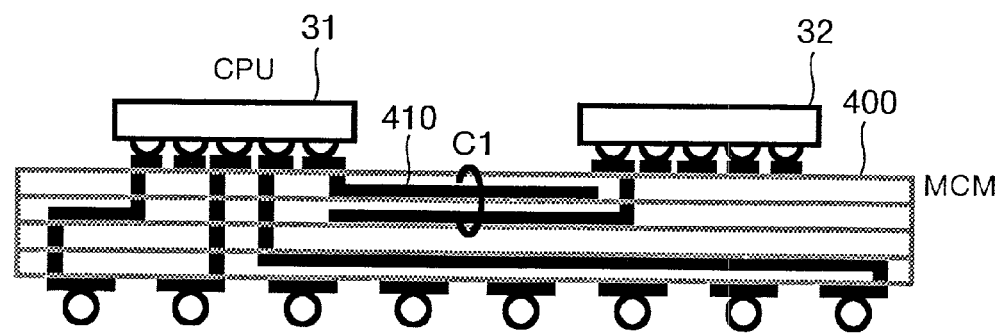
FIG. 43 is a sectional diagram showing still another embodiment in which the bus system of the invention is applied to a multi-chip module.

Still another embodiment to which the bus system is applied will be described by using FIG. 43.

In the present embodiment, a portion consisting of a plurality of chips is packaged in one multi-chip module as in the case of the processor module 400 in FIG. 27 and the previous embodiment, for example, the wiring method of FIG. 28 is applied. A processor (CPU) 31 and a cache memory 32 are provided in a multi-chip module (MCM) 400 and data transfer between them can be carried out through the wiring system shown in FIG. 28, that is, the directional coupler C1. Accordingly, high-speed data transfer can be ensured between the CPU 31 and the cache memory 32. Of course, the multi-chip module can be handled as a device that is improved in performance by having not only the function of CPU 31 but also the additional function of cache memory 32. Further, there is no need of providing MCM 400 for data transfer between the CPU 31 and the cache memory 32 in a printed circuit board packaging the CPU 31 and therefore, the construction of the printed board can be simplified to advantage.

As has been described in the foregoing embodiments, in the present invention, the remote end of the main line connected to the MC is made to be open-ended or short-circuited to cause total reflection and the reflection wave and a forward wave are used to generate backward crosstalk at the opposite ends of the directional coupler, thereby ensuring that data transfer can be effected between the DRAM and the MC connected to the opposite ends of the directional coupler, respectively. The directional coupler is used in common by two DRAM's to halve the pitch between DRAM modules.

The open-ended or short-circuited main line is folded and directional couplers are formed in cooperation with the folded main line, so that the pitch between the DRAM modules can be ¼ of the coupler wiring line length of the directional coupler.

Further, by setting up open-end or short-circuit for a signal of the DRAM, the DRAM in connection can selectively assume positive logic or negative logic and as a result, the number of signals such as chip select signals to be controlled exclusively can be reduced to advantage.

In the memory controller, a signal for data transfer is made to be binary and the impedance for the binary signal is made to be equal to a characteristic impedance of the wiring on the memory controller side. More particularly, the HiZ state for no data transfer and the H state are at the same potential such that the memory controller is driven through the impedance equal to the characteristic impedance of the wiring. When data is in L state, L signal is also driven through the impedance equal to the characteristic impedance. Through this, the reflection wave can be absorbed.

The amplitude remains unchanged when the signal is driven from HiZ state to L state and when the signal is driven from H state to L state and consequently, signals passing through the coupler during two transfer operations have the same amplitude. Thus, the signal amplitude remains unchanged during any transition of signal and the preamble can be unneeded. Since the preamble becomes unnecessary, the memory access time can be shortened and the bus utilization efficiency can be raised to thereby improve the system performance.

What is claimed is:

1. A bus system for performing data transfer between a bus master and a plurality of bus slaves that are connected to said bus system, comprising:
   a main line adapted to perform data transfer between said bus master and said bus slaves; and
   sub coupling lines disposed in non-contact relationship, in proximity and in parallel to said main line led from said bus master to form directional couplers, together with said main line,
   wherein each of said sub coupling lines is connected, at in least one end, to a bus slave and when a bus slave is connected to only the at least one end, the other end of said sub coupling line is matching-terminated by a termination resistor, and
   wherein one end of said main line to which said bus master is not connected is terminated such that total reflection takes place at said one end of said main line and a forward wave on said main line and a reflection wave from a terminated end are used to perform bi-directional data transfer between said bus slave connected to said at least one end of said sub coupling line and said bus master.

2. A bus system according to claim 1, wherein said one end of said main line not connected to said bus master is short-circuited to generate negative total reflection and a positive forward wave on said main line and the negative reflection wave from the short-circuited end are used to perform bi-directional data transfer between said bus slaves connected to opposite ends of said sub coupling line and said bus master.

3. A bus system according to claim 1, wherein said bus master incorporates a driver for data transmission and while output impedance of said driver is kept to be equal to a characteristic impedance of said main line connected to said driver, said driver delivers a LOW voltage in a state for delivery of LOW data, a HIGH voltage in a state for delivery of HIGH data and the HIGH voltage in a state for delivery of no data, and wherein said bus slave incorporates another driver for data transmission and while output impedance of said driver in said bus slave is kept to be equal to a characteristic impedance of said sub coupling line connected to said driver, said driver delivers the LOW voltage in a state for delivery of LOW data, the HIGH voltage in a state for delivery of HIGH data and the HIGH voltage in a state for delivery of no data.

4. A bus system according to claim 1, wherein said bus master incorporates a driver for data transmission and while output impedance of said driver for said bus master is kept to be equal to a characteristic impedance owned by said main line connected to said driver, said driver delivers a LOW voltage in a state for delivery of LOW data, a HIGH voltage in a state for delivery of HIGH data and the HIGH voltage in a state for delivery of no data, and wherein said bus slave incorporates another driver for data transmission and while output impedance of said driver in said bus slave is kept to be equal to a characteristic impedance of said sub coupling line connected to said driver, said driver delivers the HIGH voltage in a state for delivery of HIGH data and the HIGH voltage in a state for delivery of no data, and said driver in bus slave delivers the LOW voltage through a low impedance in a state for delivery of LOW data.

5. A bus system according to claim 1, wherein said bus master incorporates a driver for data transmission and while output impedance of said driver for said bus master is kept to be equal to a characteristic impedance of said main line connected to said driver, said driver delivers a LOW voltage in a state for delivery of LOW data, a HIGH voltage in a state for delivery of HIGH data and the HIGH voltage in a state for delivery of no data, wherein said bus slave incorporates another driver for data transmission and said driver in said bus slave delivers the HIGH voltage through an arbitrary impedance in a state for delivery of HIGH data and the LOW voltage through a low impedance in a state for delivery of LOW data, and wherein during data transfer from said bus master to a particular bus slave in a state for delivery of no data, the output impedance of said driver in said particular bus slave to which data is transferred assumes a high impedance (HiZ) and the impedance of said driver of a bus slave other than said particular bus slave equals the characteristic impedance of said sub coupling line.

6. A bus interface semiconductor device used for the said bus master and said bus slave as recited in claim 1, comprising:

a receiver for data reception; and
an input data driver, wherein said receiver includes a comparator circuit for comparing a voltage on a signal line connected during data reception with the same voltage as a HIGH voltage of said driver connected to said receiver to discriminate reception data.

7. A bus system according to claim 1, adapted to connect said bus master and a plurality of bus slaves each having a same construction, wherein for a particular one of signals for connection of said bus master and said bus slaves, said one end of said main line is short-circuited but for another signal, said one end of main line is open-ended, thereby ensuring that a negative logic connection is partly established.

8. A bus system according to claim 7, adapted to connect said bus master and a plurality of bus slaves each having a same construction, wherein for one of signals for connection of said bus master and said bus slaves that is a signal in charge of data transfer, said one end of said main line is open-ended but for a chip selecting signal, said one end of main line is short-circuited, thereby ensuring that one of two bus slaves connected to the opposite ends of said sub coupling line is selected exclusively by one signal.

9. A bus system according to claim 1, wherein said main line led out of said bus master is folded, part of wiring line of said main line from said bus master extending between said bus master and a folding point and part of wiring line of said main line inversely extending from said folding point cooperate with parts of wiring line led from said bus slaves alternately and sequentially to form directional couplers.

10. A bus system according to claim 1, having a bus for data transfer between a memory controller represented by said bus master and memory devices represented by said bus slaves, wherein concurrently with issuance of a write command for a data write from said memory controller, write data and a data strobe signal are delivered at a time.

11. A bus system according to claim 5, wherein said bus slaves receive write data from said bus master, said bus master issues a write command and thereafter, at termination of a time, delivers write data, a bus slave receiving the write command uses said write command to render an input impedance for a data signal of said bus slave high (HiZ) to cause reflection at an input terminal of said bus slave so as to double a signal amplitude of said receiving write data, a duration of rendering the input impedance high HiZ is made to be equal to or longer than a burst length of said write data, and after an end time of said write data, the input impedance of said bus slave is returned to the characteristic impedance of the line.

12. A semiconductor device used in the bus system as recited in claim 1, wherein a plurality of receivers are provided in one input/output circuit, one of them has a hysteresis function so as to receive a signal generated by the directional coupler, the other receiver is for SSTL interface, and the two kinds of receivers can be selected by bonding wire during semiconductor fabrication.

13. A differential signal bus system for performing data transfer between a bus master and bus slaves by a differential signal, wherein sub coupling lines are disposed in non-contact relationship, in proximity and in parallel to two main lines led from said bus master to form directional couplers together with said main lines, a bus slave is connected to one end of said sub coupling line or said bus slaves are connected to opposite ends of said sub coupling line, said two main lines for differential signal are short-circuited to make a loop or opened to provide an open-end at ends of said two main lines not connected with said bus master to allow bi-directional data transfer between said bus master and said bus slaves.

14. An information processing apparatus comprising:
a node controller selectively controlling access of a plurality of kinds of memory access nodes to memories;
a memory system including a plurality of memories for storing and/or reading data to be processed by said nodes and a bus system using directional couplers for performing data transfer between said node controller and said memory system,
wherein said bus system includes a main line having one end connected with said node controller; and
a plurality of sub coupling lines disposed in non-contact relationship, in proximity and in parallel to said main line to thereby form directional couplers together with said main line, at least one end of said sub coupling line is connected with one of said plurality of memories while the other end of said sub coupling line is connected with another memory of said plurality of memories or matching-terminated by a termination resistor, another end of said main line is terminated so that a signal may undergo total reflection at said other end of said main line, and a signal forward wave on said main line and a reflection wave from said other end of said main line are used to perform bi-directional data transfer between said node controller and said memory system.

15. A processor module comprising a node for controlling access of a processor to secondary cache memories, a plurality of secondary cache memories for storing and/or reading data to be processed by said processor, and a bus system using directional couplers for performing data transfer between said node and said secondary cache memories,
wherein said bus system includes a main line having one end connected with said node and a plurality of sub coupling lines disposed in non-contact relationship, in proximity and in parallel to said main line to cooperate with said main line to thereby form directional couplers, at least one end of said sub coupling line is connected with one of said plurality of memories while the other end being connected with another memory of said plurality of secondary cache memories or matching-terminated by a termination resistor, the other end of said main line is terminated so that a signal may undergo total reflection at said other end, and a signal forward wave on said main line and a reflection wave from said other end are used to perform bi-directional data transfer between said node and said plurality of secondary cache memories.

16. A processor module according to claim 15, using a memory system employing a directional coupler for a cache memory in order to store/read data processed by a processor and a multi-chip module, wherein a processor function unit is constructed of a semiconductor device different from that of a cache unit, said processor function unit, said cache unit and the directional coupler are packaged on one printed circuit board module, and said printed circuit board module further has a data input/output unit capable of performing data communication with another semiconductor device and a feed unit.

17. A bus system for performing data transfer between one bus master connected to said bus system and two bus slaves, wherein with a view to performing data transfer between said bus master and said bus slaves, a main line is led from said bus master and a sub coupling line is laid in non-contact relationship, in proximity and in parallel to said main line to cooperate with said main line so as to form a directional coupler, bus slaves are connected to opposite ends of said sub coupling line, one of opposite ends of said main line to which said bus master is not connected is terminated by an open-end to cause total reflection, the bus slave connected to the end of said sub coupling line close to said bus master has an input impedance set to a high impedance, a wiring line between said sub coupling line and said bus slave is so shortened as to be negligible as compared to a propagation delay time of said directional coupler, and a wiring line for a bus slave to be connected to the other end of said sub coupling line is led out of said sub coupling line vertically thereof, with said bus slave having an impedance substantially equal to a characteristic impedance of the wiring line, whereby a forward wave on said main line and a reflection wave from said open-end are used to perform bi-directional data transfer between said bus slaves connected to the opposite ends of said sub coupling line and said bus master.

18. A bus system according to claim 17, adapted to perform data transfer between one bus master connected to said bus system and one bus slave, wherein one end of said sub coupling line close to said bus master is terminated by an open-end to cause total reflection, and a bus slave is connected to the other end of said sub coupling line, whereby a forward wave on said main line and a reflection wave from said open-end are used to perform bi-directional data transfer between said bus slave connected to said other end of said sub coupling line.

19. A bus system according to claim 17, wherein of said two bus slaves, one bus slave having an impedance equal to the characteristic impedance of the wiring line is provided in a module, said bus master, the other bus slave and the directional coupler are packaged in a same printed circuit board, and said module is connected to said printed circuit board through a connector.

20. A bus system according to claim 19, wherein a termination module having termination means being terminated by an impedance equal to the characteristic impedance of the wiring line is provided, said bus master, the other bus slave and the directional coupler are packaged in the same printed circuit board, and said module is connected to said printed circuit board through a connector.

21. A bus system according to claim 17, adapted to perform data transfer between one bus master connected to said bus system and four bus slaves, wherein with a view to performing data transfer between said bus master and said bus slaves, sub coupling lines are laid in non-contact, in proximity and in parallel to a main line led from said bus master to cooperate with said main line so as to form directional couplers on the both sides of said main line, two bus slaves are connected to opposite ends of each of said sub coupling lines on the both sides, one of opposite ends of said main line that is not connected with said bus master is terminated by an open-end to cause total reflection, the input impedance of two bus slaves connected to ends of said sub coupling lines close to said bus master is set to a high impedance, a wiring line between said sub coupling line and said bus slave is negligibly shortened as compared to a propagation delay time of the directional coupler, wiring lines for two bus slaves connected to the other ends of said sub coupling lines are led out of said sub coupling lines vertically thereof, and each of said two sub slaves has an impedance substantially equal to the characteristic impedance of the wiring line, whereby a forward wave on said main line and a reflection wave from said open-end are used to perform bi-directional data transfer between said bus slaves connected to the opposite ends of said sub coupling lines and said bus master.

22. A bus system according to claim 21, adapted to perform data transfer between one bus master connected to said bus system and a plurality of bus slaves, wherein with a view to performing data transfer between said bus master and said bus slaves, a plurality of sub coupling lines are laid in non-contact, in proximity and in parallel to a main line led from said bus master to cooperate with said main line so as to form directional couplers on both sides of said main line, bus slaves are connected to opposite ends of each of said sub coupling lines on both sides of said main line, two bus slaves connected to ends of said sub coupling lines on both sides of said main line in close proximity to said bus master have an input impedance set to a high impedance, wiring lines for two bus slaves connected to the other ends of said coupling lines are led out of said sub coupling lines vertically thereof and said two bus slaves have an impedance substantially equal to a characteristic impedance of the wiring line, a switch is inserted in said main line between adjacent ones of directional couplers constituted by said main line and sub coupling lines, and said main line is terminated by an open-end to cause total reflection at an end where said switch is in non-conductive condition, whereby a forward wave on said main line and a reflection wave from said open-end are used to perform bi-directional data transfer between said bus slaves connected to the opposite ends of each of said sub coupling lines and said bus master.

23. A bus system for performing data transfer between one bus master connected to said bus system and two bus slaves, wherein with the a view to performing data transfer between said bus master and said bus slaves, a plurality of sub coupling lines are laid in non-contact relationship, in proximity and in parallel to a main line led from said bus master to cooperate with said main line so as to form directional couplers on both sides of said main line, ends of said sub coupling lines close to said bus master are connected in common to said bus master, the other end of each of said sub coupling lines on both sides is connected with one bus slave, said bus slave having an input impedance controlled to an impedance substantially equal to a characteristic impedance of a wiring line in the absence of bus access, data is delivered through a low impedance when bus access is present and bus drive is carried out, and said bus slave is so controlled as to have a high impedance when bus access is present and bus receive is carried out, whereby a forward wave on said main line and a reflection wave from an open-end of said main line are used to perform bi-directional data transfer between said bus slaves connected to said other ends of said sub coupling lines and said bus master.

24. A data transfer apparatus comprising a signal transmission medium for performing data transfer between a plurality of nodes connected to said transmission medium, wherein said signal transmission medium includes a main line, and at least one sub coupling line laid in non-contact relationship, in proximity and in parallel to said main line to cooperate with said main line so as to form a directional coupler, and said data transfer apparatus includes a first node connected to one end of said main line, and second and third nodes connected to opposite ends of said at least one sub coupling line, the other end of said main line being terminated to cause total reflection.

25. A data transfer apparatus according to claim 24, wherein said other end of said main line is open-ended or short-circuited.

26. A data transfer apparatus according to claim 24, wherein one of said second and third nodes is matching-terminated by a termination resistor.

27. A data transfer apparatus according to claim 24, wherein said first node is a bus master and said node connected to said sub coupling line is a bus slave.

28. A data transfer apparatus according to claim 24, wherein a forward wave on said main line and a reflection wave from said other end are used to perform bi-directional data transfer between said node connected to said sub coupling line and said first node connected to said main line.

* * * * *